US012787770B2

(12) United States Patent

Kim et al.

(10) Patent No.: US 12,787,770 B2
(45) Date of Patent: Nov. 3, 2026

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Cheol Kim, Suwon-si (KR); Hyoeun Kim, Suwon-si (KR); Huiyeong Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 260 days.

(21) Appl. No.: 18/652,490

(22) Filed: May 1, 2024

(65) Prior Publication Data

US 2025/0125217 A1 Apr. 17, 2025

(30) Foreign Application Priority Data

Oct. 16, 2023 (KR) ........................ 10-2023-0137914

(51) Int. Cl.
*H01L 23/373* (2006.01)
*H10D 62/40* (2025.01)
(Continued)

(52) U.S. Cl.
CPC .......... *H10W 40/253* (2026.01); *H10D 62/40* (2025.01); *H10D 62/60* (2025.01);
(Continued)

(58) Field of Classification Search
CPC . H10W 40/253; H10W 20/20; H10W 74/111; H10W 90/00; H10W 90/701;
(Continued)

(56) References Cited

U.S. PATENT DOCUMENTS 6,790,684 B2 9/2004 Ahn et al.
7,019,271 B2 3/2006 Wnek et al.
(Continued)

FOREIGN PATENT DOCUMENTS

CN 110660751 B * 4/2025 ............ H10W 40/22
JP 6800461 B2 * 12/2020
(Continued)

OTHER PUBLICATIONS

Cahill et al., "Nanoscale thermal transport", Journal of Applied Physics, Jan. 15, 2003, pp. 793-818, vol. 93.
(Continued)

*Primary Examiner* — Jarrett J Stark
(74) *Attorney, Agent, or Firm* — Sughrue Mion, PLLC

(57) ABSTRACT

Disclosed are semiconductor packages and their fabrication methods. The semiconductor package comprises a first semiconductor chip, a second semiconductor chip on a top surface of the first semiconductor chip and having a width less than that of the first semiconductor chip, and a molding layer on the first semiconductor chip and surrounding the second semiconductor chip. The first semiconductor chip includes a first semiconductor substrate and a first circuit layer on a top surface of the first semiconductor substrate. The first semiconductor substrate includes a first part adjacent to the top surface of the first semiconductor substrate and a second part adjacent to a bottom surface of the first semiconductor substrate. The first and second parts include the same semiconductor material. The first part has a single crystalline structure. The second part may have a polycrystalline structure.

20 Claims, 17 Drawing Sheets

(51) Int. Cl.

| | |
|---|---|
| ***H10D 62/60*** | (2025.01) |
| ***H10W 20/20*** | (2026.01) |
| ***H10W 40/25*** | (2026.01) |
| ***H10W 74/10*** | (2026.01) |
| ***H10W 90/00*** | (2026.01) |

(52) U.S. Cl.
CPC .......... *H10W 20/20* (2026.01); *H10W 74/111* (2026.01); *H10W 90/00* (2026.01); *H10W 90/701* (2026.01); *H10W 90/722* (2026.01); *H10W 90/792* (2026.01)

(58) Field of Classification Search
CPC . H10W 90/722; H10W 90/792; H10W 90/28; H10W 90/297; H10W 90/724; H10W 70/614; H10W 70/05; H10W 74/01; H10W 74/131; H10W 42/00; H10W 70/60; H10W 72/01; H10W 90/20; H10W 40/257; H10W 90/288; H10D 62/40; H10D 62/60; F16L 59/02
See application file for complete search history.

(56) References Cited

U.S. PATENT DOCUMENTS

| | | | | |
|---|---|---|---|---|
| 8,829,657 | B2 | 9/2014 | Kim et al. | |
| 9,337,164 | B2 | 5/2016 | Hegde | |
| 10,483,185 | B2 | 11/2019 | Minoura et al. | |
| 11,296,051 | B2 | 4/2022 | Kao et al. | |
| 2019/0057986 | A1* | 2/2019 | Wang | H10D 86/00 |
| 2020/0006176 | A1 | 1/2020 | Tsai et al. | |
| 2022/0352083 | A1 | 11/2022 | Huang et al. | |
| 2024/0120305 | A1* | 4/2024 | Ecton | H10W 70/611 |
| 2025/0125217 | A1* | 4/2025 | Kim | H10D 62/40 |

FOREIGN PATENT DOCUMENTS

| | | | | |
|---|---|---|---|---|
| TW | 202017062 | A * | 5/2020 | H10W 90/00 |
| TW | 202449992 | A * | 12/2024 | H10W 20/096 |

OTHER PUBLICATIONS

Braun et al., "Size effects on the thermal conductivity of amorphous silicon thin films", Physical Review B, Apr. 1, 2016, 5 total pages, vol. 93, doi:10.1103/PhysRevB.93.140201.

Siegert et al., "Impact of vacancy ordering on thermal transport in crystalline phase-change materials", Dec. 4, 2014, 13 total pages, vol. 78, doi:10.1088/0034-4885/78/1/013001.

Yu et al., "Ge Ion Implanted Photonic Devices and Annealing for Emerging Applications", Micromachines, Feb. 12, 2022, 20 total pages, vol. 13, doi:10.3390/mi13020291.

* cited by examiner

SEMICONDUCTOR PACKAGE AND METHOD OF FABRICATING THE SAME

CROSS-REFERENCE TO RELATED APPLICATION

This U.S. nonprovisional application is based on and claims priority under 35 U.S.C § 119 to Korean Patent Application No. 10-2023-0137914 filed on Oct. 16, 2023, in the Korean Intellectual Property Office, the disclosure of which is hereby incorporated by reference in its entirety.

BACKGROUND

1. Field

The disclosure relates to a semiconductor package and a method of fabricating the same, and more particularly, to a stacked semiconductor package and a method of fabricating the same.

2. Description of Related Art

In the semiconductor industry, integrated circuit packaging technology has been developed to satisfy requirements for small-form-factor devices and high package reliability. For instance, package techniques capable of achieving a chip-size package are actively being developed to satisfy the requirements for small-form-factor devices, and package techniques capable of promoting efficiency in a package process and improving mechanical and electrical reliability of a packaged product have attracted considerable attention in terms of high package reliability.

In the semiconductor industry, high capacity, thinness, and small size of semiconductor packages and electronic products using the same have been demanded and thus various package techniques have been suggested. One approach of the various package techniques is a packaging technique which vertically stacks a plurality of semiconductor chips to achieve a high-density chip stacking. This packaging technique has an advantage capable of integrating semiconductor chips having various functions on a small area than a conventional package consisting of one semiconductor chip.

SUMMARY

Provided is a method of fabricating a semiconductor package with less occurrence of failure and a semiconductor package fabricated by the same.

Further, provided is a method of fabricating a semiconductor package with increased process efficiency and a semiconductor package fabricated by the same.

According to an aspect of the disclosure, a semiconductor package includes: a first semiconductor chip; a second semiconductor chip on a top surface of the first semiconductor chip, the second semiconductor chip comprising a width less than a width of the first semiconductor chip; and a molding layer on the first semiconductor chip and surrounding the second semiconductor chip, wherein the first semiconductor chip comprises: a first semiconductor substrate; and a first circuit layer on a top surface of the first semiconductor substrate, wherein the first semiconductor substrate comprises: a first part adjacent to the top surface of the first semiconductor substrate; and a second part adjacent to a bottom surface of the first semiconductor substrate, wherein the first part and the second part comprise a semiconductor material, wherein the first part comprises a single crystalline structure, and wherein the second part comprises a polycrystalline structure.

According to an aspect of the disclosure, a semiconductor package includes: a first semiconductor chip; a second semiconductor chip on a top surface of the first semiconductor chip; a molding layer on the first semiconductor chip and surrounding the second semiconductor chip; a redistribution substrate on the molding layer and the second semiconductor chip; a conductive post that vertically penetrates the molding layer and connects the redistribution substrate to the first semiconductor chip; and an external terminal coupled to the redistribution substrate, wherein the first semiconductor chip comprises: a first semiconductor substrate; a first circuit layer on a top surface of the first semiconductor substrate; and a first pad on a top surface of the first circuit layer, wherein the first semiconductor substrate comprises a heat shield layer in the first semiconductor substrate, and wherein the heat shield layer is spaced apart from the top surface of the first semiconductor substrate by a distance of about 100 nanometers to about 500 nanometers.

According to an aspect of the disclosure, a method of fabricating a semiconductor package includes: providing a first semiconductor chip that includes a first semiconductor substrate and a first circuit layer on a top surface of the first semiconductor substrate; forming a heat shield layer in the first semiconductor substrate; forming on the first semiconductor chip a conductive post coupled to the first circuit layer; providing a second semiconductor chip that includes a second semiconductor substrate and a second circuit layer on a top surface of the second semiconductor substrate; performing an annealing process to mount the second semiconductor chip on the first semiconductor chip; forming on the first semiconductor chip a molding layer, wherein the molding layer surrounds the second semiconductor chip; and forming a redistribution substrate on the molding layer and the second semiconductor chip, wherein the heat shield layer and the first semiconductor substrate include a semiconductor material, wherein the first semiconductor substrate includes a single crystalline structure, and wherein the heat shield layer includes an amorphous structure or a polycrystalline structure.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
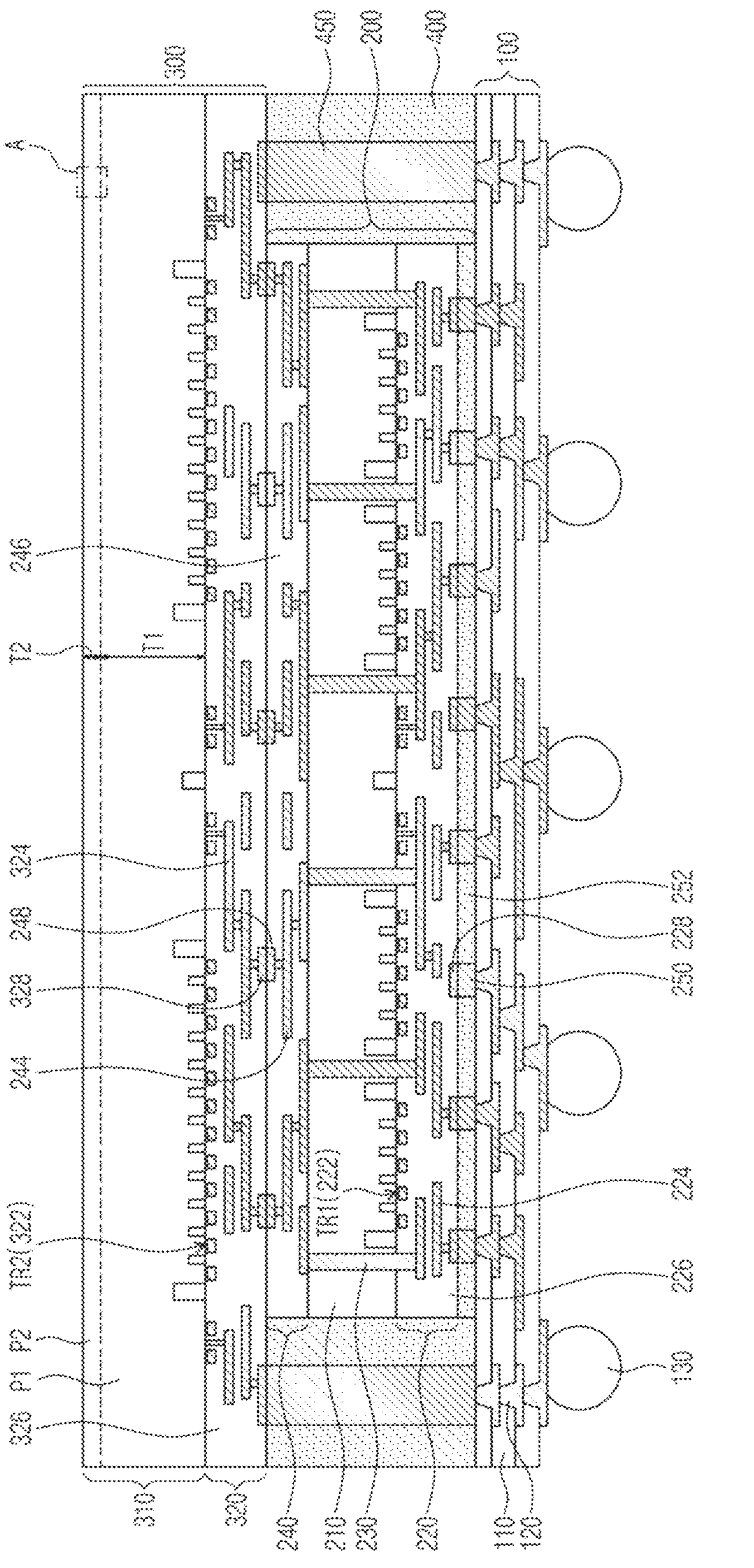
FIG. 1 is a cross-sectional view showing a semiconductor package according to one or more embodiments of the disclosure.

The following will now describe a semiconductor package according to the disclosure with reference to the accompanying drawings.

In the following description, like reference numerals refer to like elements throughout the specification. According to embodiments, a plurality of "unit", "module", "member", and "block" may be implemented as a single component or a single "unit", "module", "member", and "block" may include a plurality of components.

It will be understood that when an element is referred to as being "connected" with or to another element, it can be directly or indirectly connected to the other element.

Also, when a part "includes" or "comprises" an element, unless there is a particular description contrary thereto, the part may further include other elements, not excluding the other elements.

Throughout the description, when a member is "on" another member, this includes not only when the member is in contact with the other member, but also when there is another member between the two members.

Herein, the expressions "at least one of a, b or c" and "at least one of a, b and c" indicate "only a," "only b," "only c," "both a and b," "both a and c," "both b and c," and "all of a, b, and c."

It will be understood that, although the terms first, second, third, etc., may be used herein to describe various elements, is the disclosure should not be limited by these terms. These terms are only used to distinguish one element from another element.

As used herein, the singular forms "a," "an" and "the" are intended to include the plural forms as well, unless the context clearly indicates otherwise.

With regard to any methods or processes described herein, an identification code may be used for the convenience of the description but is not intended to illustrate the order of each step or operation. Each step or operation may be implemented in an order different from the illustrated order unless the context clearly indicates otherwise.

Figure 2:
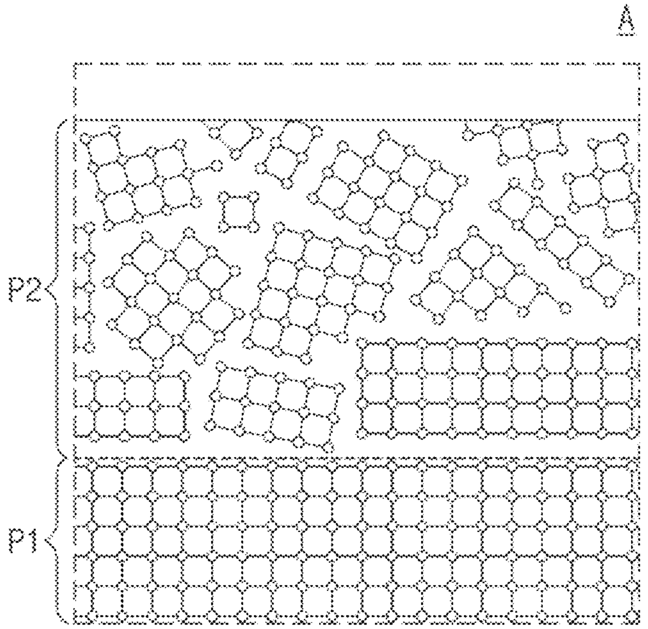
FIGS. 2 and 3 are diagrams showing a crystal structure of section A depicted in FIG. 1.
Figure 3:
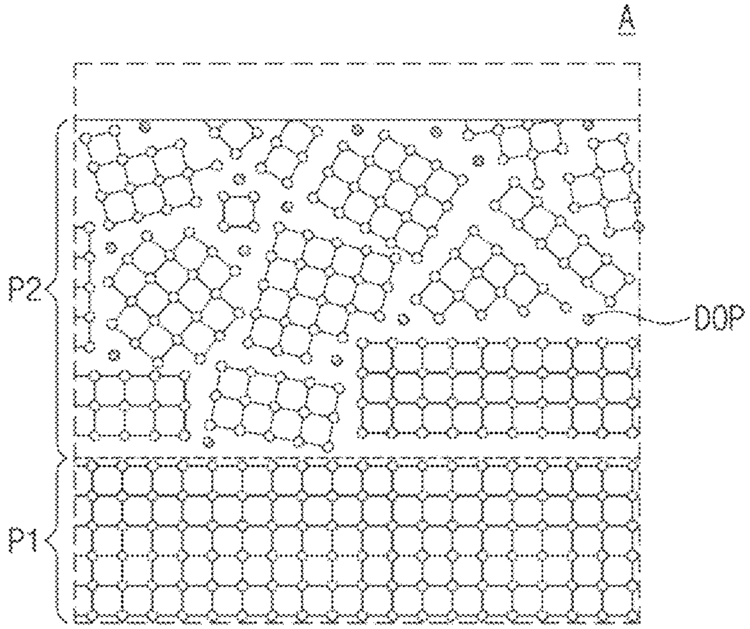

FIG. 1 is a cross-sectional view showing a semiconductor package according to one or more embodiments of the disclosure. FIGS. 2 and 3 are diagrams showing a crystal structure of section A depicted in FIG. 1.

Referring to FIG. 1, a redistribution substrate 100 may be provided. The redistribution substrate 100 may include one or more substrate wiring layers that are stacked on each other. Each of the substrate wiring layers may include a redistribution dielectric layer 110 and a redistribution conductive pattern 120 in the redistribution dielectric layer 110. When the substrate wiring layer is provided in plural, the redistribution conductive pattern 120 of one substrate wiring layer may be electrically connected to the redistribution conductive pattern 120 of an adjacent substrate wiring layer. The following will describe the redistribution dielectric layer 110 and the redistribution conductive pattern 120 of a single substrate wiring layer.

The redistribution dielectric layer 110 may include a photo-imageable dielectric (PID). For example, the photo-imageable dielectric may include at least one selected from photosensitive polyimide (PI), polybenzoxazole (PBO), phenolic polymers, and benzocyclobutene polymers. Alternatively, the redistribution dielectric layer 110 may include a dielectric material. For example, the redistribution dielectric layer 110 may include silicon oxide (SiO), silicon nitride (SiN), silicon oxynitride (SiON), silicon carbonitride (SiCN), or dielectric polymers.

The redistribution conductive pattern 120 may be provided on the redistribution dielectric layer 110. The redistribution conductive pattern 120 may horizontally extend on the redistribution dielectric layer 110. The redistribution conductive pattern 120 may be a component for redistribution in the redistribution substrate 100. The redistribution conductive pattern 120 may include a conductive material. For example, the redistribution conductive pattern 120 may include copper (Cu) or aluminum (Al).

The redistribution conductive pattern 120 may have a damascene structure. For example, the redistribution conductive pattern 120 may have a head part and a tail part that are connected into a single unitary piece. The head and tail parts of the redistribution conductive pattern 120 may have an inverse T-shape cross-section.

The head part of the redistribution conductive pattern 120 may be a wiring or pad portion for horizontal expansion of a wiring line in the redistribution substrate 100. The head part may be provided on a bottom surface of the redistribution dielectric layer 110. For example, the head part may protrude onto the bottom surface of the redistribution dielectric layer 110. The redistribution conductive pattern 120 of a lowermost one of the substrate wiring layers may be exposed on a bottom surface of a lowermost redistribution dielectric layer 110 or a bottom surface of the redistribution substrate 100. The exposed redistribution conductive pattern 120 may be substrate pads to which external terminals 130 are coupled. Alternatively, the redistribution substrate 100 may be provided on its bottom surface with bumps or pads to which the external terminals 130 are coupled, and the pads may be coupled to the exposed redistribution conductive pattern 120.

The tail part of the redistribution conductive pattern 120 may be a via portion for vertical connection of a wiring line in the redistribution substrate 100. The tail part may be coupled to an overlying substrate wiring layer. For example, the tail part of the redistribution conductive pattern 120 may extend from a top surface of the head part, and may penetrate the redistribution dielectric layer 110 to be coupled to the head part of the redistribution conductive pattern 120 of an overlying substrate wiring layer. The tail part of the redistribution conductive pattern 120 of an uppermost one of the substrate wiring layers may penetrate the redistribution dielectric layer 110 to be exposed on a top surface of the redistribution substrate 100 or a top surface of the redistribution dielectric layer 110 of the uppermost substrate wiring layer. The redistribution conductive pattern 120 of the uppermost substrate wiring layer may be electrically coupled to a first semiconductor chip 200 and conductive posts 450 which will be discussed below.

The external terminals 130 may be provided on the bottom surface of the redistribution substrate 100. The external terminals 130 may be coupled to the redistribution conductive pattern 120 of the lowermost substrate wiring layer. The external terminals 130 may include solder balls or solder bumps, and based on type and arrangement of the external terminals 130, a semiconductor package may be provided in the shape of one of a ball grid array (BGA) type, a fine ball-grid array (FBGA) type, and a land grid array (LGA) type.

A first semiconductor chip 200 may be disposed on the redistribution substrate 100. The first semiconductor chip 200 may include an integrated element therein. For example, the first semiconductor chip 200 may be a wafer-level die formed of a semiconductor, such as silicon (Si). The first semiconductor chip 200 may have a front surface and a rear surface. In the following description, the term "front surface" may be defined to indicate an active surface of an integrated element in a semiconductor chip, a surface on which wiring lines are formed, or a surface on which pads of a semiconductor chip are formed, and the term "rear surface" may be defined to indicate a surface opposite to the front surface. The front surface of the first semiconductor chip 200 may be directed toward the redistribution substrate 100. For example, the first semiconductor chip 200 may be disposed in a face-down state on the redistribution substrate 100.

The first semiconductor chip 200 may include a first semiconductor substrate 210, a first circuit layer 220, first vias 230, and a redistribution layer 240.

The first semiconductor substrate 210 may be provided. The first semiconductor substrate 210 may include a semiconductor material. For example, the first semiconductor substrate 210 may be a monocrystalline silicon substrate. The first semiconductor substrate 210 may have a top surface and a bottom surface that are opposite to each other. The bottom surface of the first semiconductor substrate 210 may be a front surface of the first semiconductor substrate 210, and the top surface of the first semiconductor substrate 210 may be a rear surface of the first semiconductor substrate 210. As used herein, the front surface of the first semiconductor substrate 210 may be defined to indicate a surface on which semiconductor elements are formed or mounted in the first semiconductor substrate 210 or on which wiring lines and pads are formed in the first semiconductor substrate 210, and the rear surface of the first semiconductor substrate 210 may be defined to indicate a surface opposite to the front surface. For example, the bottom surface of the first semiconductor substrate 210 may be an active surface.

The first semiconductor chip 200 may have the first circuit layer 220 provided on the bottom surface of the first semiconductor substrate 210. The first circuit layer 220 may include a first semiconductor element 222 and a first device wiring part 224.

The first semiconductor element 222 may include transistors TR1 provided on the bottom surface of the first semiconductor substrate 210. For example, the transistors TR1 may each include a source and a drain that are formed on a lower portion of the first semiconductor substrate 210, a gate electrode disposed on the bottom surface of the first semiconductor substrate 210, and a gate dielectric layer interposed between the first semiconductor substrate 210 and the gate electrode. The first semiconductor element 222 may include a plurality of transistors TR1. The first semiconductor element 222 may include a memory circuit or a logic circuit. The first semiconductor element 222 may include a device isolation pattern, a logic cell, or a plurality of memory cells disposed on the bottom surface of the first semiconductor substrate 210. Alternatively, the first semiconductor element 222 may include a passive element, such as a capacitor.

The bottom surface of the first semiconductor substrate 210 may be covered with a first device interlayer dielectric layer 226. The first device interlayer dielectric layer 226 may bury the first semiconductor element 222. For example, the first semiconductor element 222 may not be exposed by the first device interlayer dielectric layer 226. The first device interlayer dielectric layer 226 may include, for example, at least one selected from silicon oxide (SiO), silicon nitride (SiN), and silicon oxynitride (SiON). Alternatively, the first device interlayer dielectric layer 226 may include a low-k dielectric material. The first device interlayer dielectric layer 226 may have a mono-layered structure or a multi-layered structure. When the first device interlayer dielectric layer 226 is provided in the shape of the multi-layered structure, an etch stop layer may be interposed between the dielectric layers. For example, the etch stop layer may be provided on a bottom surface of each dielectric layer. The etch stop layer may include, for example, one of silicon nitride (SiN), silicon oxynitride (SiON), and silicon carbonitride (SiCN).

The first device interlayer dielectric layer 226 may be provided therein with a first device wiring part 224 connected to the transistors TR1. The first device wiring part 224 may include wiring patterns buried in the first device interlayer dielectric layer 226. For example, the wiring patterns may include redistribution patterns for horizontal wiring and via patterns for vertical connection. The first device wiring part 224 may vertically penetrate the first device interlayer dielectric layer 226 to come into connection with one of a source electrode, a drain electrode, and a gate electrode of the transistor TR1. Alternatively, the first device wiring part 224 may be connected to various components of the first semiconductor element 222. The first device wiring part 224 may be positioned between top and bottom surfaces of the first device interlayer dielectric layer 226. The first device wiring part 224 may include, for example, copper (Cu) or tungsten (W).

The first device interlayer dielectric layer 226 may be provided with first pads 228 on a lower portion thereof. The first pads 228 may have their bottom surfaces exposed on the bottom surface of the first device interlayer dielectric layer 226. The bottom surfaces of the first pads 228 may coplanar with that of the first device interlayer dielectric layer 226. The first pads 228 may be connected to the first device wiring part 224. The first pads 228 may include, for example, copper (Cu) or tungsten (W).

The first vias 230 may be provided to vertically penetrate the first semiconductor substrate 210 to connect with the first device wiring part 224. The first vias 230 may be patterns for vertical wiring. The first vias 230 may vertically penetrate the first device interlayer dielectric layer 226 to be coupled to a top surface of a portion of the first device wiring part 224. The first vias 230 may vertically penetrate the first device interlayer dielectric layer 226 and the first semiconductor substrate 210 to be exposed on the top surface of the first semiconductor substrate 210. The first vias 230 may include, for example, tungsten (W).

The first device interlayer dielectric layer 226 may be provided thereon with conductive bumps 250. The conductive bumps 250 may be disposed on the bottom surfaces of the first pads 228. The conductive bumps 250 may be coupled to the bottom surfaces of the first pads 228 of the first device wiring part 224. For example, the conductive bumps 250 may be bonding terminals that protrude onto the bottom surfaces of the first pads 228. The conductive bumps 250 may include a metallic material. For example, the conductive bumps 250 may include copper (Cu).

A front protection layer 252 may be provided on the first circuit layer 220. On the bottom surface of the first device interlayer dielectric layer 226, the front protection layer 252 may surround the conductive bumps 250. The conductive bumps 250 may not be covered with the front protection layer 252, and may be exposed on a bottom surface of the front protection layer 252. The front protection layer 252 may include a dielectric material. For example, the front protection layer 252 may include a dielectric polymer material, such as an epoxy molding compound (EMC).

The redistribution layer 240 may be disposed on the top surface of the first semiconductor substrate 210. The redistribution layer 240 may include a redistribution wiring part 244 and a redistribution dielectric layer 246.

The top surface of the first semiconductor substrate 210 may be covered with the redistribution dielectric layer 246. The redistribution dielectric layer 246 may include, for example, at least one selected from silicon oxide (SiO), silicon nitride (SiN), and silicon oxynitride (SiON). Alternatively, the redistribution dielectric layer 246 may include a low-k dielectric material. The redistribution dielectric layer 246 may have a mono-layered structure or a multi-layered structure. When the redistribution dielectric layer 246 is provided as the multi-layered structure, an etch stop layer may be interposed between the dielectric layers.

The redistribution dielectric layer 246 may be provided therein with the redistribution wiring part 244 connected to the first vias 230. The redistribution wiring part 244 may include wiring patterns buried in the redistribution dielectric layer 246. For example, the wiring patterns may include redistribution patterns for horizontal wiring and via patterns for vertical connection. The redistribution wiring part 244 may vertically penetrate the redistribution dielectric layer 246 to come into connection with the first vias 230. The redistribution wiring part 244 may be positioned between top and bottom surfaces of the redistribution dielectric layer 246. The redistribution wiring part 244 may include, for example, copper (Cu) or tungsten (W).

The redistribution dielectric layer 246 may be provided with second pads 248 on an upper portion thereof. The second pads 248 may have their top surfaces that are exposed on the top surface of the redistribution dielectric layer 246. The top surfaces of the second pads 248 may be coplanar with that of the redistribution dielectric layer 246. The second pads 248 may be connected to the redistribution wiring part 244. The second pads 248 may include, for example, copper (Cu) or tungsten (W).

The first semiconductor chip 200 may be mounted on the redistribution substrate 100. For example, the front protection layer 252 of the first semiconductor chip 200 may be directed toward the top surface of the redistribution substrate 100. The front protection layer 252 of the first semiconductor chip 200 may be in contact with the top surface of the redistribution substrate 100. On an interface between the first semiconductor chip 200 and the redistribution substrate 100, the conductive bumps 250 of the first semiconductor chip 200 may be in contact with the redistribution conductive pattern 120 of the redistribution substrate 100. For example, the redistribution conductive pattern 120 of the uppermost substrate wiring layer of the redistribution substrate 100 may include a portion that penetrates the redistribution dielectric layer 110 to be coupled to the conductive bumps 250.

According to one or more embodiments, the first semiconductor chip 200 may not be in contact with the top surface of the redistribution substrate 100. For example, the first semiconductor chip 200 may be vertically spaced apart from the top surface of the redistribution substrate 100. In this case, the portion of the redistribution conductive pattern 120 of the redistribution substrate 100 may penetrate the redistribution dielectric layer 110 to extend toward the first semiconductor chip 200, thereby being coupled to the conductive bumps 250.

A molding layer 400 may be provided on the redistribution substrate 100. On the redistribution substrate 100, the molding layer 400 may surround the first semiconductor chip 200. The first semiconductor chip 200 may be exposed on a top surface of the molding layer 400. A top surface of the first semiconductor chip 200 may be coplanar with that of the molding layer 400. The molding layer 400 may include a dielectric material. For example, the molding layer 400 may include a dielectric polymer polymeric material, such as an epoxy molding compound (EMC).

The redistribution substrate 100 may be provided thereon with conductive posts 450. The conductive posts 450 may be a configuration of vertical connection terminals for connecting a subsequently described second semiconductor chip 300 to the redistribution substrate 100. The conductive posts 450 may be horizontally spaced apart from the first semiconductor chip 200. The conductive posts 450 may have a pillar shape. The conductive posts 450 may vertically penetrate the molding layer 400. For example, the conductive posts 450 may extend toward and may be exposed on the top surface of the molding layer 400. The conductive posts 450 may have their top surfaces coplanar with that of the molding layer 400 and that of the first semiconductor chip 200. The conductive posts 450 may extend toward a bottom surface of the molding layer 400 to be coupled to the redistribution conductive pattern 120 of the redistribution substrate 100. For example, the redistribution conductive pattern 120 of the uppermost substrate wiring layer of the redistribution substrate 100 may include a portion that penetrates the redistribution dielectric layer 110 to be coupled to the conductive posts 450. The conductive posts 450 may include a conductive material. The conductive posts 450 may include a metallic material, such as copper (Cu) or tungsten (W).

A second semiconductor chip 300 may be disposed on the first semiconductor chip 200 and the molding layer 400. The second semiconductor chip 300 may include an integrated element therein. For example, the second semiconductor chip 300 may be a wafer-level die formed of a semiconductor, such as silicon (Si). The second semiconductor chip 300 may have a front surface and a rear surface. The front surface of the second semiconductor chip 300 may be directed toward the redistribution substrate 100. For example, the second semiconductor chip 300 may be disposed in a face-down state on the first semiconductor chip 200 and the molding layer 400. A width of the second semiconductor chip 300 may be greater than that of the first semiconductor chip 200. An entirety of the first semiconductor chip 200 may vertically overlap a portion of the second semiconductor chip 300. Another portion of the second semiconductor chip 300 may vertically overlap the molding layer 400 positioned on one side of the first semiconductor chip 200. The second semiconductor chip 300 may have their lateral surfaces aligned with those of the molding layer 400.

The second semiconductor chip 300 may include a second semiconductor substrate 310 and a second circuit layer 320.

The second semiconductor substrate 310 may be provided. The second semiconductor substrate 310 may include a semiconductor material. For example, the second semiconductor substrate 310 may be a monocrystalline silicon substrate. The second semiconductor substrate 310 may have a top surface and a bottom surface that are opposite to each other. The bottom surface of the second semiconductor substrate 310 may be a front surface of the second semiconductor substrate 310, and the top surface of the second semiconductor substrate 310 may be a rear surface of the second semiconductor substrate 310. As used herein, the front surface of the second semiconductor substrate 310 may be defined to indicate a surface on which semiconductor elements are formed or mounted in the second semiconductor substrate 310 or on which wiring lines and pads are formed in the second semiconductor substrate 310, and the rear surface of the second semiconductor substrate 310 may be defined to indicate a surface opposite to the front surface. For example, the bottom surface of the second semiconductor substrate 310 may be an active surface.

Referring together to FIGS. 1 and 2, the second semiconductor substrate 310 may have a first part P1 and a second part P2. The first part P1 may be a portion adjacent to the front surface of the second semiconductor substrate 310 or the bottom surface of the second semiconductor substrate 310. For example, the first part P1 of the second semiconductor substrate 310 may be a portion on which semiconductor elements are formed or mounted in the second semiconductor substrate 310 or a portion on which wiring lines and pads are formed. The second part P2 may be a portion adjacent to the rear surface of the second semiconductor substrate 310 or the top surface of the second semiconductor substrate 310. The second part P2 may be exposed on the top surface of the second semiconductor substrate 310. The first part P1 may separate the second part P2 from the second circuit layer 320 which will be discussed below. In the disclosure, for convenience of description, the second semiconductor substrate 310 is divided into the first part P1 and the second part P2, but the first part P1 and the second part P2 may all be a portion of the second semiconductor substrate 310 and may be a semiconductor layer formed of the same material (e.g., silicon (Si)).

A numerical value of about 100 nanometers to about 500 nanometers may be given as a thickness T1 of the first part P1, or a distance from the bottom surface of the second semiconductor substrate 310 to a boundary between the first part P1 and the second part P2. However, the distance from the bottom surface of the second semiconductor substrate 310 to the boundary between the first part P1 and the second part P2 is merely exemplary, and the disclosure is not limited thereto. The thickness T1 of the first part P1 may be equal to or greater than about 500 nanometers. For example, the second part P2 may be positioned far away at about at least 100 nanometers from the front surface of the second semiconductor substrate 310 on which is formed a second semiconductor element 322 which will be discussed below. The second semiconductor element 322 may include detailed components such as a device isolation pattern, an n-well layer, a p-well layer, and/or a buried gate electrode formed on a lower portion of the second semiconductor substrate 310. As used herein, a formation depth of the second semiconductor element 322 or a depth of the second semiconductor element 322 may indicate a distance from the front surface of the second semiconductor substrate 310 to a most distant one of the detailed components of the second semiconductor element 322. The thickness T1 of the first part P1 may be greater than about 20 times the formation depth of the second semiconductor element 322. This will be further discussed below in detail in describing a method of fabricating a semiconductor package. A numerical value of about 1 nanometer to about 50 nanometers may be given as a thickness T2 of the second part P2, or a distance from the boundary between the first part P1 and the second part P2 to the top surface of the second semiconductor substrate 310.

The first part P1 may have more lattice defects than the second part P2. For example, a dislocation density of the first part P1 may be less than that of the second part P2. As used herein, the term "dislocation density" may mean an amount of linear lattice defects per unit area present in a crystal, or a dislocation line per unit volume (i.e., $cm/cm^3$) for dislocation. The first part P1 may have a single crystalline structure. The second part P2 may have a polycrystalline structure. An average grain size of the second part P2 may decrease with increasing distance from the first part P1. As used herein, an average grain area may be obtained by dividing a certain area by the number of grains included in the certain area, and the diameter of a circle having the average grain area may be defined as the average grain size. Alternatively, an average grain size may be determined by diameter measurement, ASTM grain size number, or the like. For convenience of description, FIG. 2 exaggerates a grain shape and a grain size, and a size ratio between grains and components of the semiconductor package may be different from an actual ratio.

In FIGS. 1 and 2, it is described that the first part P1 and the second part P2 of the second semiconductor substrate 310 include the same semiconductor material (e.g., silicon (Si)), but the disclosure is not limited thereto.

Referring to FIGS. 1 and 3, the second part P2 may further include an impurity DOP whose number of valence electrons is the same as that of the semiconductor material. For example, when the second semiconductor substrate 310 is formed of silicon (Si), the impurity DOP may include germanium (Ge). The second part P2 may be implanted with the impurity DOP to provide a lattice defect to the second part P2 in the second semiconductor substrate 310 provided as a single crystalline structure. This will be further discussed below in detail in describing a method of fabricating a semiconductor package. A concentration of the impurity DOP in the second part P2 may be greater than a concentration of the impurity DOP in the first part P1. For example, the first part P1 may not include the impurity DOP. For convenience of description, FIG. 3 exaggerates a grain shape and a grain size, and a size ratio between grains and components of the semiconductor package may be different from an actual ratio.

According to one or more embodiments of the disclosure, the second part P2 of the second semiconductor substrate 310 may be provided as a polycrystalline structure adjacent to the rear surface of the second semiconductor chip 300. Therefore, thermal energy required for a bonding process of the first semiconductor chip 200 and the second semiconductor chip 300 may be prevented from being discharged through the second semiconductor substrate 310 onto the rear surface of the second semiconductor chip 300, and there may be a reduction in thermal energy required for the bonding process. This will be further discussed below in detail in describing a method of fabricating a semiconductor package.

Referring still to FIG. 1, the second semiconductor chip 300 may have the second circuit layer 320 provided on the bottom surface of the second semiconductor substrate 310. The second circuit layer 320 may include a second semiconductor element 322 and a second device wiring part 324.

The second semiconductor element 322 may include transistors TR2 provided on the bottom surface of the second semiconductor substrate 310. For example, the transistors TR2 may each include a source and a drain that are formed on a lower portion of the second semiconductor substrate 310, a gate electrode disposed on the bottom surface of the second semiconductor substrate 310, and a gate dielectric layer interposed between the second semiconductor substrate 310 and the gate electrode. The second semiconductor element 322 may include a plurality of transistors TR2. The second semiconductor element 322 may include a memory circuit or a logic circuit. The second semiconductor element 322 may include a device isolation pattern, a logic cell, and/or a plurality of memory cells disposed on the bottom surface of the second semiconductor substrate 310. Alternatively, the second semiconductor element 322 may include a passive element, such as a capacitor.

The bottom surface of the second semiconductor substrate 310 may be covered with a second device interlayer dielectric layer 326. The second device interlayer dielectric layer 326 may bury the second semiconductor element 322. For example, the second semiconductor element 322 may not be exposed by the second device interlayer dielectric layer 326. The second device interlayer dielectric layer 326 may include, for example, at least one selected from silicon oxide (SiO), silicon nitride (SiN), and silicon oxynitride (SiON). Alternatively, the second device interlayer dielectric layer 326 may include a low-k dielectric material. The second device interlayer dielectric layer 326 may have a mono-layered structure or a multi-layered structure. When the second device interlayer dielectric layer 326 is provided as the multi-layered structure, an etch stop layer may be interposed between the dielectric layers.

The second device interlayer dielectric layer 326 may be provided therein with the second device wiring part 324 connected to the transistors TR2. The second device wiring part 324 may include wiring patterns buried in the second device interlayer dielectric layer 326. For example, the wiring patterns may include redistribution patterns for horizontal wiring and via patterns for vertical connection. The second device wiring part 324 may vertically penetrate the second device interlayer dielectric layer 326 to come into connection with one of a source electrode, a drain electrode, and a gate electrode of the transistor TR2. Alternatively, the second device wiring part 324 may be connected to various components of the second semiconductor element 322. The second device wiring part 324 may be positioned between top and bottom surfaces of the second device interlayer dielectric layer 326. The second device wiring part 324 may include, for example, copper (Cu) or tungsten (W).

The second device interlayer dielectric layer 326 may be provided with third pads 328 on a lower portion thereof. The third pads 328 may have their bottom surfaces exposed on the bottom surface of the second device interlayer dielectric layer 326. The bottom surfaces of the third pads 328 may be coplanar with that of the second device interlayer dielectric layer 326. The third pads 328 may be connected to the second device wiring part 324. The third pads 328 may include, for example, copper (Cu) or tungsten (W).

The second semiconductor chip 300 may be mounted on the first semiconductor chip 200. For example, the second semiconductor chip 300 may be disposed on the molding layer 400 and the first semiconductor chip 200. The second circuit layer 320 of the second semiconductor chip 300 may be directed toward the top surface of the first semiconductor chip 200. The third pads 328 of the second semiconductor chip 300 may be vertically aligned with the second pads 248 of the first semiconductor chip 200 and the conductive posts 450. The second semiconductor chip 300 may be in contact with the first semiconductor chip 200, the molding layer 400, and the conductive posts 450.

On an interface between the first semiconductor chip 200 and the second semiconductor chip 300, the redistribution dielectric layer 246 of the first semiconductor chip 200 may be bonded to the second device interlayer dielectric layer 326 of the second semiconductor chip 300. In this case, the redistribution dielectric layer 246 and the second device interlayer dielectric layer 326 may constitute a hybrid bonding of oxide, nitride, or oxynitride. As used herein, the term "hybrid bonding" may denote a bonding in which two components of the same kind are merged at an interface therebetween. For example, a continuous configuration may be provided between the redistribution dielectric layer 246 and the second device interlayer dielectric layer 326 that are bonded to each other, and an invisible interface may be present between the redistribution dielectric layer 246 and the second device interlayer dielectric layer 326. For example, the redistribution dielectric layer 246 and the second device interlayer dielectric layer 326 may be formed of the same material, and no interface may be present between the redistribution dielectric layer 246 and the second device interlayer dielectric layer 326. The redistribution dielectric layer 246 and the second device interlayer dielectric layer 326 may be provided as a single component. For example, the redistribution dielectric layer 246 and the second device interlayer dielectric layer 326 may be bonded to constitute a single unitary piece. The disclosure, however, is not limited thereto. The redistribution dielectric layer 246 and the second device interlayer dielectric layer 326 may be formed of different materials from each other. No continuous configuration may be provided between the redistribution dielectric layer 246 and the second device interlayer dielectric layer 326, and a visible interface may be present between the redistribution dielectric layer 246 and the second device interlayer dielectric layer 326.

The first semiconductor chip 200 may be connected to the second semiconductor chip 300. For example, the first semiconductor chip 200 and the second semiconductor chip 300 may be in contact with each other. On the interface between the first semiconductor chip 200 and the second semiconductor chip 300, the second pads 248 of the first semiconductor chip 200 may be bonded to the third pad 328 of the second semiconductor chip 300. In this case, a hybrid bonding may be accomplished between the second pads 248 and the third pads 328. For example, a continuous configuration may be provided between the second pads 248 and the third pads 328 that are bonded to each other, and an invisible interface may be present between the second pads 248 and the third pads 328. The second pads 248 and the third pads 328 may be formed of the same material, and thus no interface may be present between the second pads 248 and the third pads 328. Thus, the second pad 248 and the third pads 328 may be provided as a single component. For example, the second pad 248 and the third pad 328 may be bonded to constitute a single unitary piece.

The second semiconductor chip 300 may be connected to the conductive posts 450. For example, the conductive posts 450 may vertically penetrate the molding layer 400 to be coupled to the bottom surfaces of ones of the third pads 328 of the second semiconductor chip 300.

In the embodiments that follow, a detailed description of technical features repetitive to those discussed above with reference to FIGS. 1 to 3 will be omitted, and a difference thereof will be discussed in detail. The same reference numerals may be allocated to the same components as those of the semiconductor package discussed above according to one or more embodiments of the disclosure.

Figure 4:
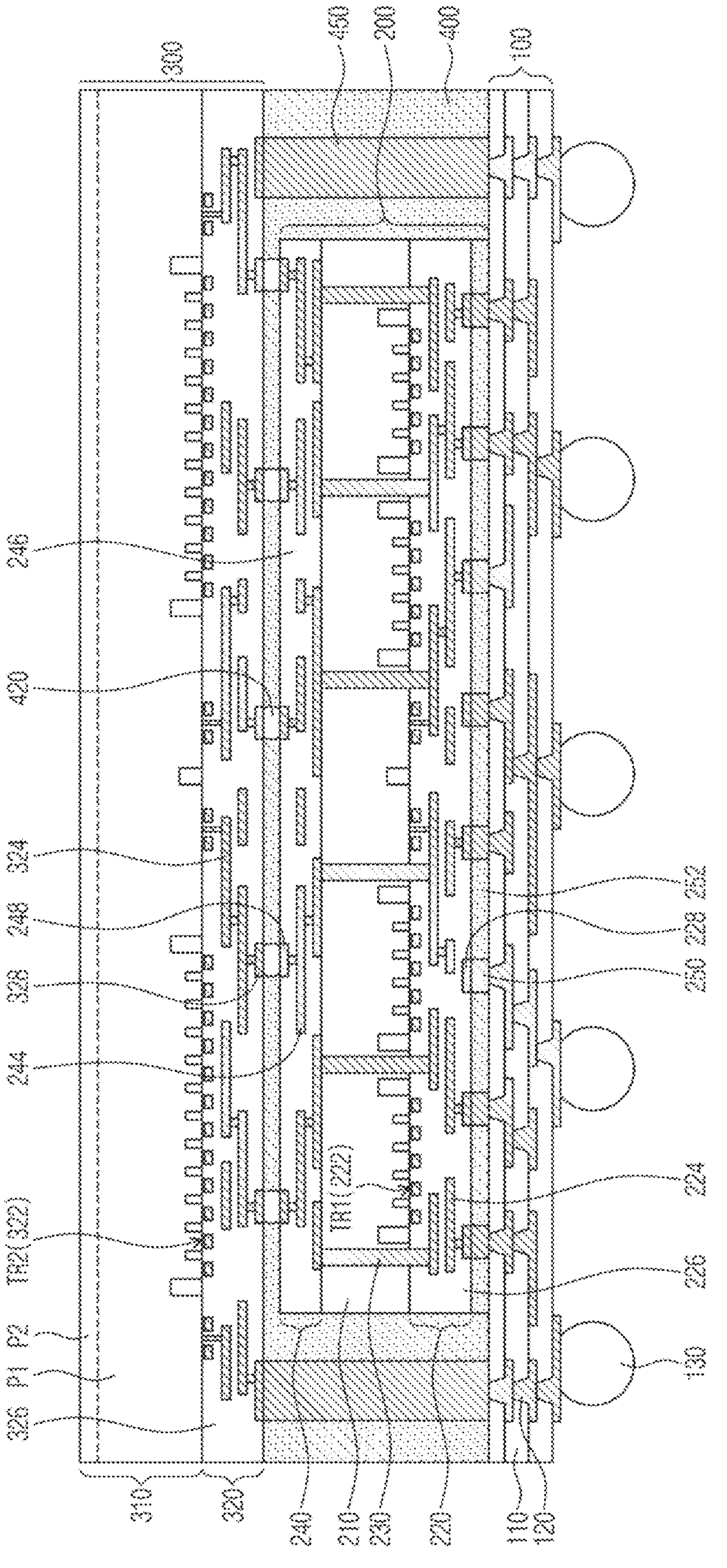
FIGS. 4, 5 and 6 are cross-sectional views showing a semiconductor package according to one or more embodiments of the disclosure.

FIG. 4 illustrates a cross-sectional view showing a semiconductor package according to one or more embodiments of the disclosure.

FIG. 1 depicts that the first semiconductor chip 200 and the second semiconductor chip 300 are directly bonded to each other, but the disclosure is not limited thereto.

Referring to FIG. 4, connection terminals 420 may be provided on the top surface of the first semiconductor chip 200. The connection terminals 420 may be disposed on the second pads 248 of the first semiconductor chip 200. The connection terminals 420 may include solder balls or solder bumps.

The molding layer 400 may be provided on the redistribution substrate 100. On the redistribution substrate 100, the molding layer 400 may surround the first semiconductor chip 200. The molding layer 400 may cover the top surface of the first semiconductor chip 200.

The conductive posts 450 may be provided on the redistribution substrate 100. The conductive posts 450 may vertically penetrate the molding layer 400. For example, the conductive posts 450 may extend toward and may be exposed on the top surface of the molding layer 400. The top surfaces of the conductive posts 450 may be coplanar with that of the molding layer 400. The top surfaces of the conductive posts 450 and the top surface of the molding layer 400 may be located at higher level than that of the top surface of the first semiconductor chip 200.

The second semiconductor chip 300 may be disposed on the molding layer 400. A bottom surface of the second semiconductor chip 300 may be vertically spaced apart from the top surface of the first semiconductor chip 200.

The second semiconductor chip 300 may be mounted on the first semiconductor chip 200. For example, the connection terminals 420 may connect the third pads 328 of the second semiconductor chip 300 to the second pads 248 of the first semiconductor chip 200. The molding layer 400 may surround the connection terminals 420, while filling a space between the first semiconductor chip 200 and the second semiconductor chip 300.

Figure 5:
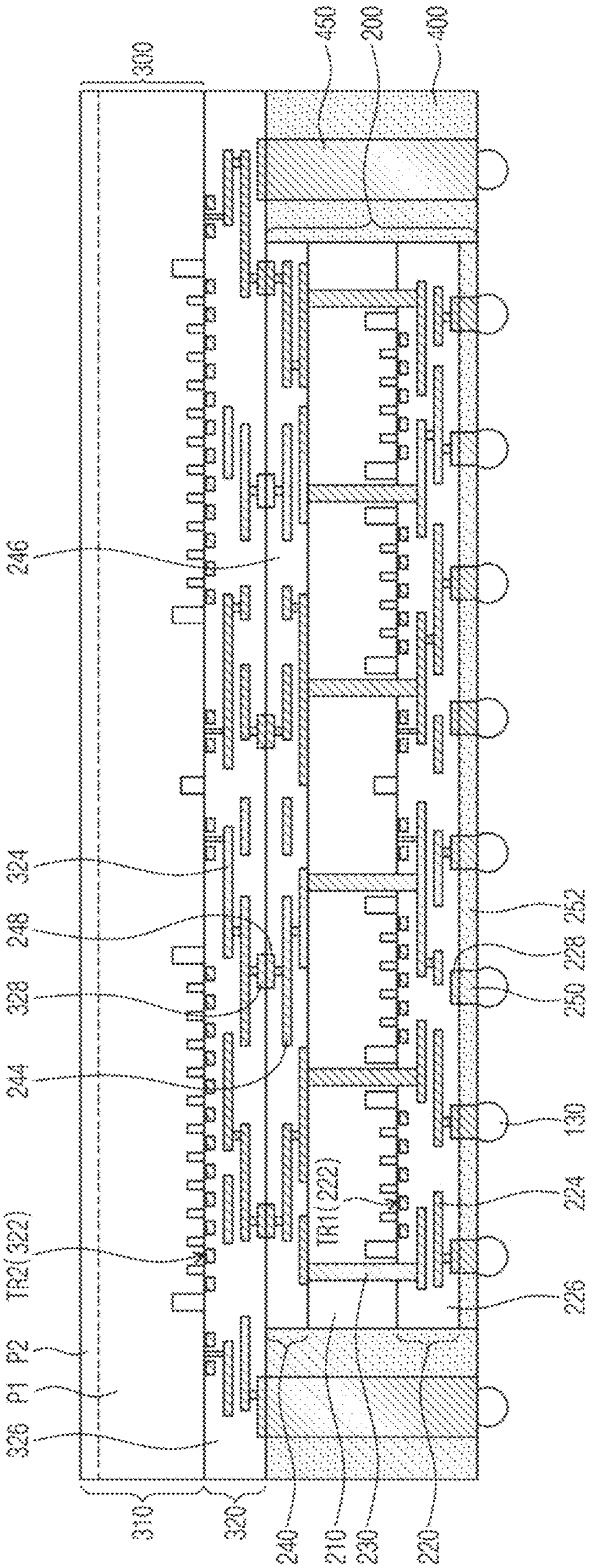

FIG. 5 illustrates a cross-sectional view showing a semiconductor package according to one or more embodiments of the disclosure.

Referring to FIG. 5, a semiconductor package may not include the redistribution substrate (see 100 of FIG. 1).

The conductive posts 450 may have bottom surfaces that are exposed on the bottom surface of the molding layer 400. The conductive bumps 250 may have bottom surfaces that are exposed on a bottom surface of the first semiconductor chip 200.

The external terminals 130 may be provided on the bottom surfaces of the conductive posts 450 and the bottom surfaces of the conductive bumps 250.

Figure 6:
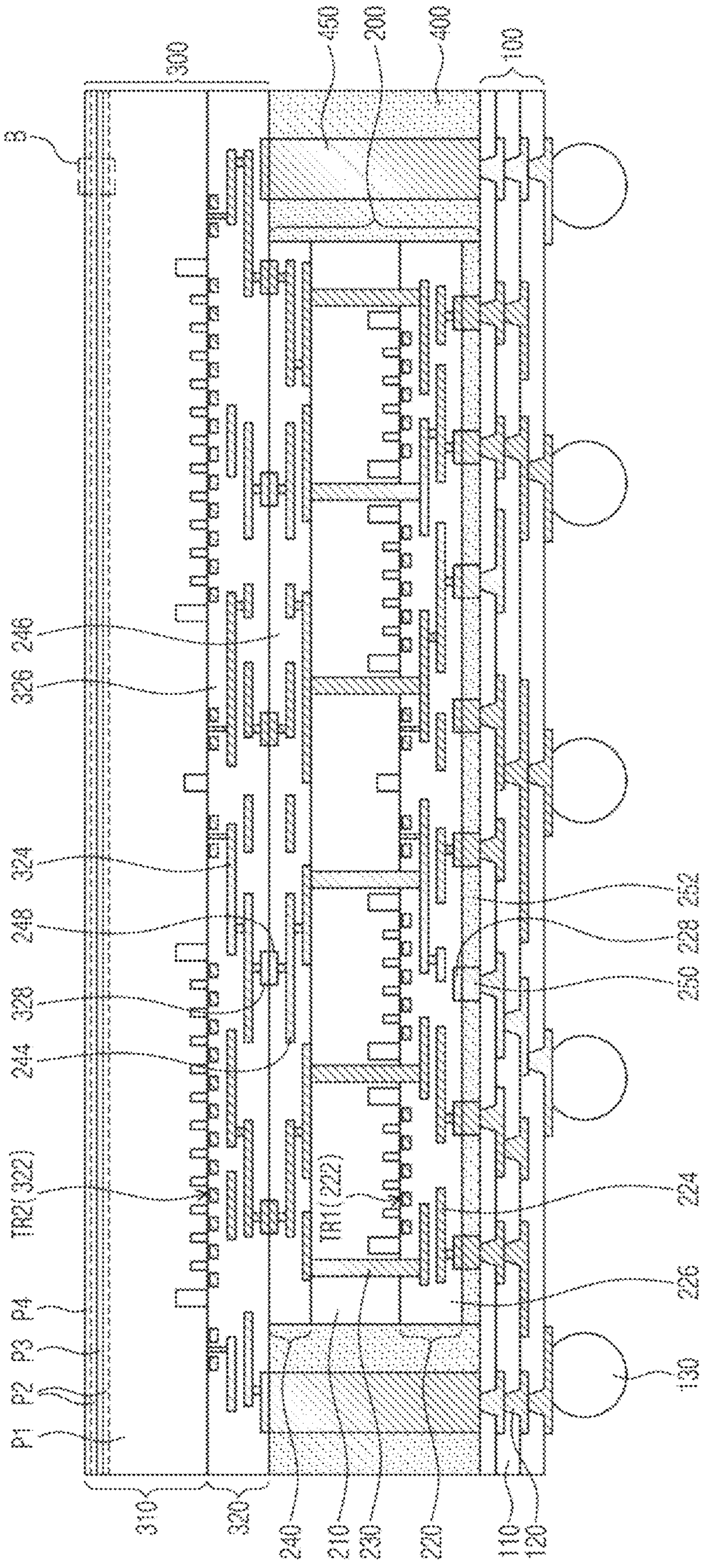
Figure 7:
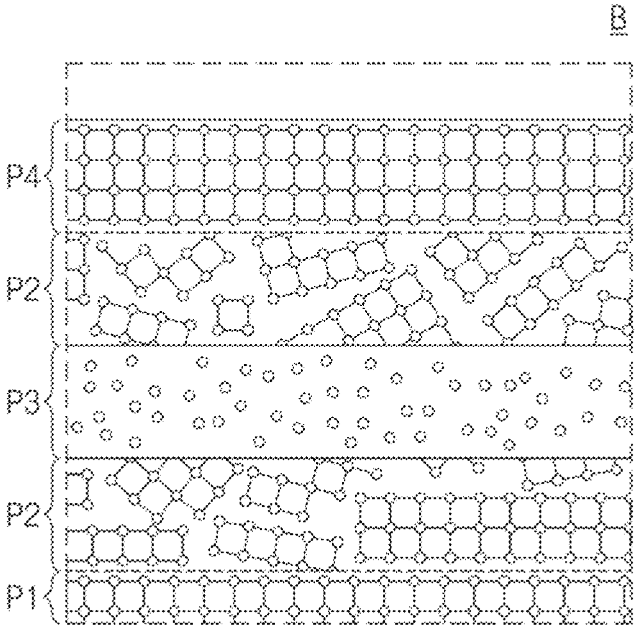
FIGS. 7 and 8 are diagrams showing a crystal structure of section B depicted in FIG. 6.
Figure 8:
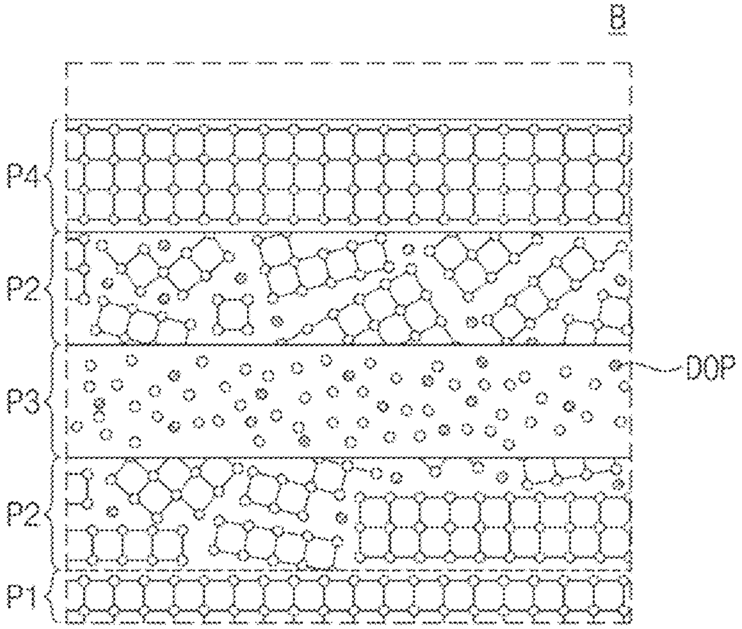

FIG. 6 illustrates a cross-sectional view showing a semiconductor package according to one or more embodiments of the disclosure. FIGS. 7 and 8 illustrate diagrams showing a crystal structure of section B depicted in FIG. 6.

Referring to FIGS. 6 and 7, the second semiconductor substrate 310 may have a first part P1, second parts P2, a third part P3, and a fourth part P4. The first part P1 may be a portion adjacent to the front surface of the second semiconductor substrate 310 or the bottom surface of the second semiconductor substrate 310. For example, the first part P1 of the second semiconductor substrate 310 may be a portion on which semiconductor elements are formed or mounted in the second semiconductor substrate 310 or a portion on which wiring lines and pads are formed. The fourth part P4 may be a portion adjacent to the rear surface of the second semiconductor substrate 310 or the top surface of the second semiconductor substrate 310. The fourth part P4 may be exposed on the top surface of the second semiconductor substrate 310. The second parts P2 may be interposed between the first part P1 and the fourth part P4. The third part P3 may be interposed between the second parts P2. For example, the second parts P2 may be portions provided on opposite sides of the third part P3. The first part P1 may separate the second parts P2 and the third part P3 from the second circuit layer 320 which will be discussed below. In the disclosure, for convenience of description, the second semiconductor substrate 310 is divided into the first part P1, the second parts P2, the third part P3, and the fourth part P4, but the first part P1, the second parts P2, the third part P3, and the fourth part P4 may all be a portion of the second semiconductor substrate 310 and may be a semiconductor layer formed of the same material (e.g., silicon (Si)). The third part P3 may be a heat shield layer provided in the second semiconductor substrate 310. For example, the third part P3 may have a thermal conductivity less than those of the first and fourth parts P1 and P4. The first and fourth parts P1 and P4 may be remaining portions of the second semiconductor substrate 310 on which the third part P3 is not provided.

A numerical value of about 100 nanometers to about 500 nanometers may be given as a thickness of the first part P1, or a distance from the bottom surface of the second semiconductor substrate 310 to a boundary between the first part P1 and a second part P2. However, the distance from the bottom surface of the second semiconductor substrate 310 to the boundary between the first part P1 and a second part P2 is a merely exemplary, and the disclosure is not limited thereto. The thickness of the first part P1 may be equal to or greater than about 500 nanometers. For example, the second parts P2 may be positioned far away at about at least 100 nanometers from the front surface of the second semiconductor substrate 310 on which the second semiconductor element 322 is formed. The second semiconductor element 322 may include detailed components such as a device isolation pattern, an n-well layer, a p-well layer, and/or a buried gate electrode formed on a lower portion of the second semiconductor substrate 310. As used herein, a formation depth of the second semiconductor element 322 or a depth of the second semiconductor element 322 may indicate a distance from the front surface of the second semiconductor substrate 310 to a most distant one of the detailed components of the second semiconductor element 322. The thickness of the first part P1 may be greater than about 20 times the formation depth of the second semiconductor element 322.

The third part P3 may have a thickness of about 2 nanometers to about 100 nanometers.

A numerical value of about 40 nanometers to about 50 nanometers may be given as thicknesses of the second parts P2, or a distance from the third part P3 to the first part P1 and a distance from the third part P3 to the fourth part P4.

The first part P1 and the fourth part P4 may have their lattice defects fewer than those of the third part P3. For example, dislocation densities of the first and fourth parts P1 and P4 may be less than that of the third part P3. The first and fourth parts P1 and P4 may have their single crystalline crystal structures. The third part P3 may have an amorphous structure. The second parts P2 may have their lattice defects more than those of the first and fourth parts P1 and P4 and fewer than those of the third part P3. For example, the second parts P2 may have dislocation densities less than that of the third part P3 and greater than those of the first and fourth parts P1 and P4. The second parts P2 may have polycrystalline structures. An average grain size of the second parts P2 may decrease with increasing distance from the first and fourth parts P1 and P4 and with decreasing distance from the third part P3. For example, the second parts P2 may be interfacial layers between the first and fourth parts P1 and P4 and the third part P3, or between single crystalline first and fourth parts P1 and P4 and an amorphous third part P3. For convenience of description, FIG. 7 exaggerates a grain shape and a grain size, and a size ratio between grains and components of the semiconductor package may be different from an actual ratio.

FIGS. 6, 7 and 8 depict that the first, second, third, and fourth parts P1, P2, P3, and P4 of the second semiconductor substrate 310 include the same semiconductor material (e.g., silicon (Si)), but the disclosure is not limited thereto.

Referring to FIGS. 6 and 8, the second parts P2 and the third part P3 may further include an impurity DOP whose number of valence electrons is the same as that of the semiconductor material. For example, when the second semiconductor substrate 310 is formed of silicon (Si), the impurity DOP may include germanium (Ge). The second parts P2 and the third part P3 may be implanted with the impurity DOP to provide a lattice defect to the second parts P2 and the third part P3 in the second semiconductor substrate 310 provided as a single crystalline structure. A concentration of the impurity DOP in the second parts P2 may be greater than a concentration of the impurity DOP in the first and fourth parts P1 and P4. For example, neither the first part P1 nor the fourth part P4 may include the impurity DOP. A concentration of the impurity DOP in the second parts P2 may be less than a concentration of the impurity DOP in the third part P3. For convenience of description, FIG. 8 exaggerates a grain shape and a grain size, and a size ratio between grains and components of the semiconductor package may be different from an actual ratio.

According to one or more embodiments, the fourth part P4 may not be provided. For example, the second semiconductor substrate 310 may have the first part P1, the second parts P2, and the third part P3. One of the second parts P2 may be a portion adjacent to the rear surface of the second semiconductor substrate 310, or the top surface of the second semiconductor substrate 310. The one of the second parts P2 may be exposed on the top surface of the second semiconductor substrate 310.

Figure 9:
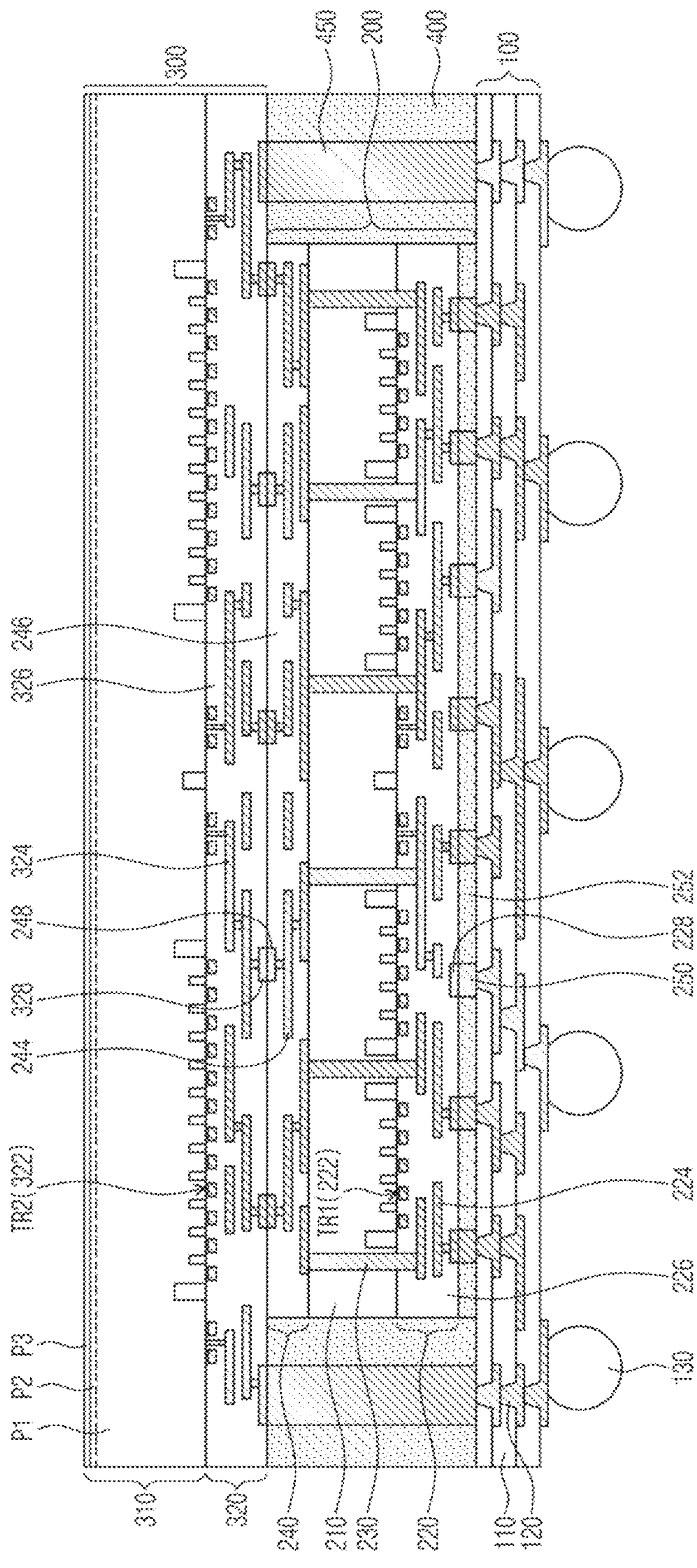
FIG. 9 is a cross-sectional view showing a semiconductor package according to one or more embodiments of the disclosure.

FIG. 9 illustrates a cross-sectional view showing a semiconductor package according to one or more embodiments of the disclosure.

Unlike the embodiments of FIGS. 6 to 8, the second semiconductor substrate 310 may have a first part P1, a second part P2, and a third part P3. The third part P3 may be a portion adjacent to the rear surface of the second semiconductor substrate 310, or the top surface of the second semiconductor substrate 310. The third part P3 may be exposed on the top surface of the second semiconductor substrate 310. The second part P2 may be interposed between the first part P1 and the third part P3.

FIGS. 10 to 20 illustrate cross-sectional views showing a method of fabricating a semiconductor package according to one or more embodiments of the disclosure.

Figure 10:
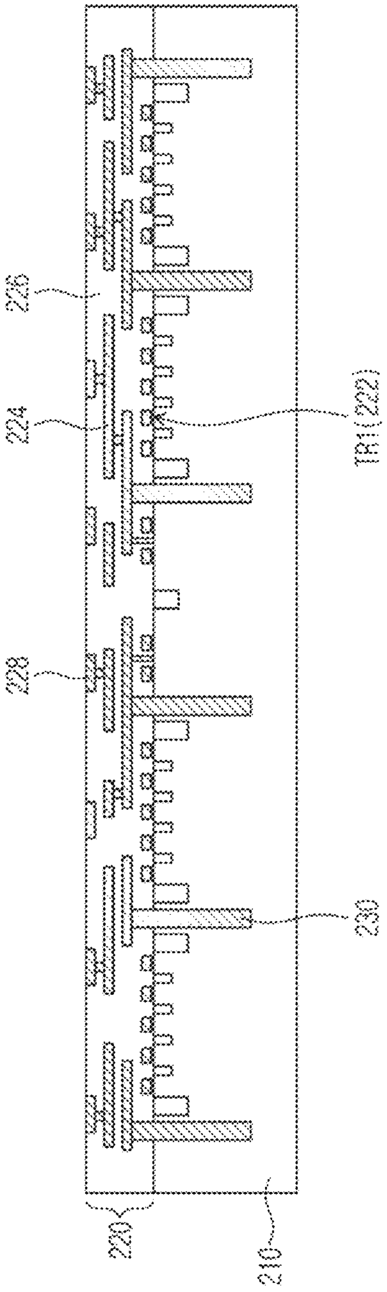
FIGS. 10, 11, 12, 13, 14, 15, 16, 17, 18, 19 and 20 are cross-sectional views showing a method of fabricating a semiconductor package according to one or more embodiments of the disclosure.

Referring to FIG. 10, a first semiconductor substrate 210 may be provided. The first semiconductor substrate 210 may include a semiconductor material. For example, the first semiconductor substrate 210 may be a monocrystalline silicon substrate.

A first circuit layer 220 and first vias 230 may be formed on a top surface of the first semiconductor substrate 210. For example, a typical process may be performed on the top surface of the first semiconductor substrate 210 to form a first semiconductor element 222 including a plurality of transistors TR1. The first vias 230 may be formed in the first semiconductor substrate 210. The first vias 230 may have their ends that are exposed on or protrude onto the top surface of the first semiconductor substrate 210. The first vias 230 may have their other ends that are positioned in the first semiconductor substrate 210. For example, the first vias 230 may not be exposed on a bottom surface of the first semiconductor substrate 210. A deposition and patterning of a dielectric layer and a deposition and patterning of a conductive layer may be repeatedly performed on the top surface of the first semiconductor substrate 210 to form a first device interlayer dielectric layer 226, a first device wiring part 224, and first pads 228. However, in the disclosure, the formation of the first circuit layer 220 is not limited thereto, and a typical method may be used to form the first circuit layer 220.

Figure 11:
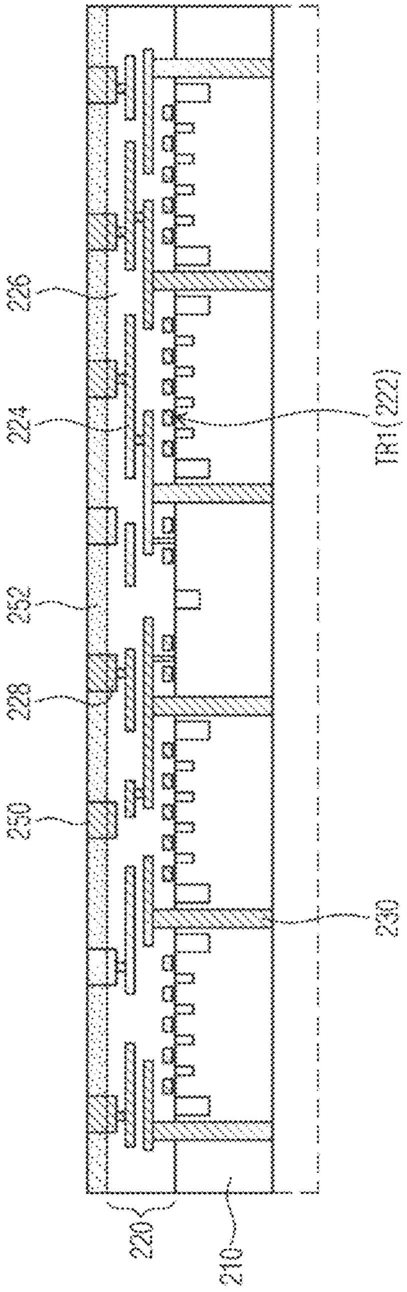

Referring to FIG. 11, conductive bumps 250 and a front protection layer 252 may be formed on the first circuit layer 220. For example, after a sacrificial layer is formed on the first circuit layer 220, the sacrificial layer may be patterned to form openings that expose the first pads 228, and the openings may be filled with a conductive material to form the conductive bumps 250. The front protection layer 252 may be formed on the first circuit layer 220 to surround the conductive bumps 250. Alternatively, after the formation on the first circuit layer 220 the front protection layer 252 having the openings that expose the first pads 228, the openings may be filled with a conductive material to form the conductive bumps 250.

Afterwards, a first thinning process may be performed on the bottom surface of the first semiconductor substrate 210. The first thinning process may polish the bottom surface of the first semiconductor substrate 210. For example, the bottom surface of the first semiconductor substrate 210 may undergo a planarization process such as chemical mechanical polishing (CMP). The first thinning process may reduce a thickness of the first semiconductor substrate 210. The first semiconductor substrate 210 may become planarized. The first thinning process may expose bottom surfaces of the first vias 230.

Figure 12:
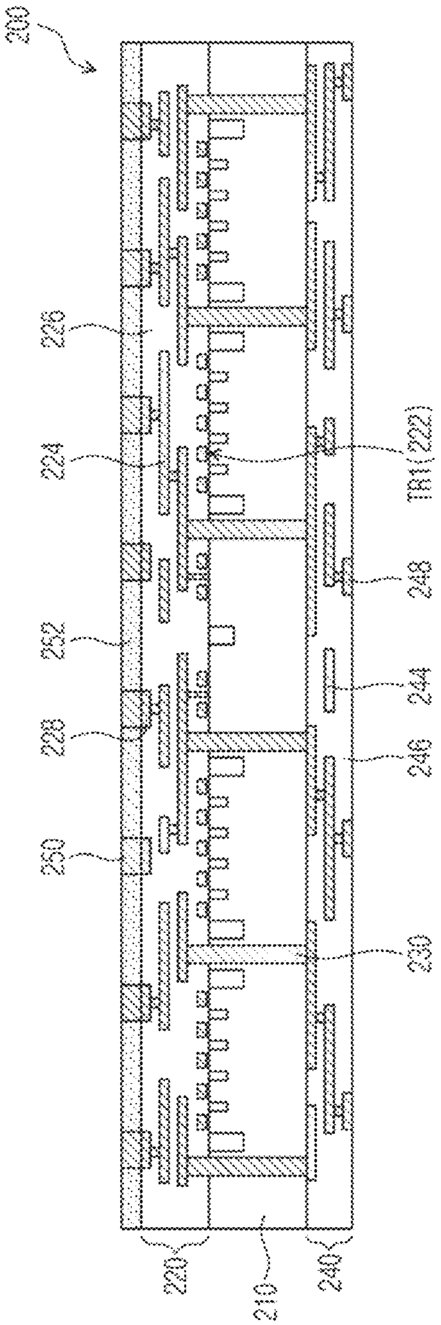

Referring to FIG. 12, a redistribution layer 240 may be formed on the bottom surface of the first semiconductor substrate 210. For example, a deposition and patterning of a dielectric layer and a deposition and patterning of a conductive layer may be repeatedly performed on the bottom surface of the first semiconductor substrate 210 to form a redistribution wiring part 244, a redistribution dielectric layer 246, and second pads 248. However, in the disclosure, the formation of the redistribution layer 240 is not limited thereto, and a typical method may be used to form the redistribution layer 240. Through the processes above, a first semiconductor chip 200 may be manufactured.

Figure 13:
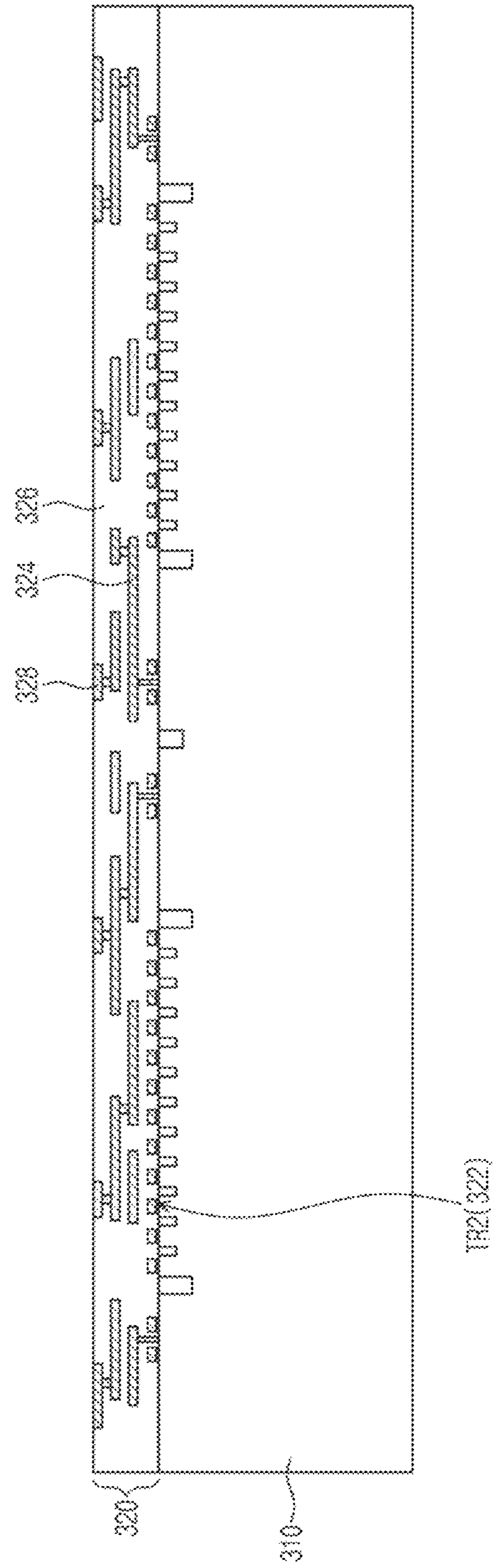

Referring to FIG. 13, a second semiconductor substrate 310 may be provided. The second semiconductor substrate 310 may include a semiconductor material. For example, the second semiconductor substrate 310 may be a monocrystalline silicon substrate.

A second circuit layer 320 may be formed on a top surface of the second semiconductor substrate 310. For example, a typical process may be performed on the top surface of the second semiconductor substrate 310 to form a second semiconductor element 322 including a plurality of transistors TR2. A deposition and patterning of a dielectric layer and a deposition and patterning of a conductive layer may be repeatedly performed on the top surface of the second semiconductor substrate 310 to form a second device interlayer dielectric layer 326, a second device wiring part 324, and third pads 328. However, in the disclosure, the formation of the second circuit layer 320 is not limited thereto, and a typical method may be used to form the second circuit layer 320.

Figure 14:
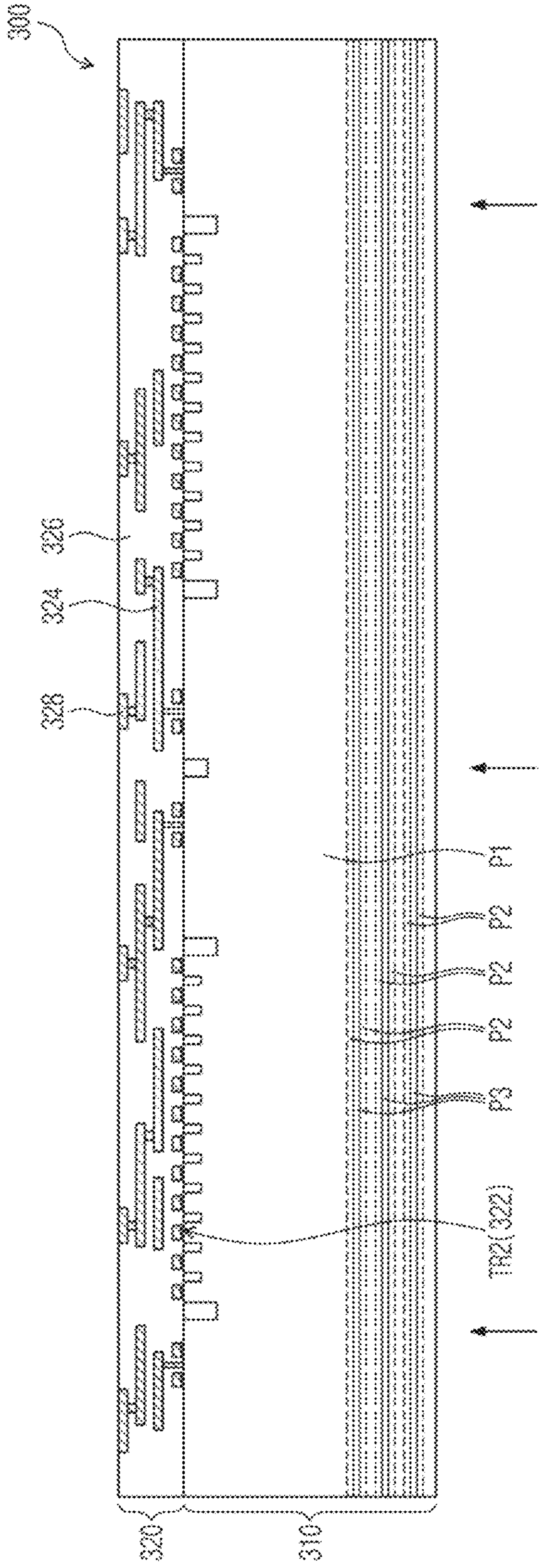

Referring to FIG. 14, third parts P3 may be formed in the second semiconductor substrate 310. The third parts P3 may be heat shield layers provided in the second semiconductor substrate 310. For example, crystallinity of the single crystalline second semiconductor substrate 310 may be partially changed to form the third parts P3. For example, as indicated by arrows in FIG. 14, a bottom surface of the second semiconductor substrate 310 may undergo an implantation process in which the third parts P3 are implanted with impurities. The impurity may be either a material that is the same as a semiconductor material included in the second semiconductor substrate 310 or a material with a number of valence electrons that is the same as that of the semiconductor material. The third parts P3 may have an excessive increase in the number of atoms included in the semiconductor material, or the third parts P3 may be implanted with a material whose atoms have a size different from that of atoms included in the semiconductor material. Therefore, the third parts P3 may have an increase in lattice defect, and a crystal structure of the third parts P3 may be changed into an amorphous or polycrystalline structure.

Alternatively, a laser annealing process may be performed on the third parts P3. The laser annealing process may break bonds of atoms of the semiconductor material in the third parts P3. Therefore, the third parts P3 may have an increase in lattice defect, and a crystal structure of the third parts P3 may be changed into an amorphous or polycrystalline structure. The third parts P3 having an amorphous or polycrystalline structure may have a thermal conductivity less than that of the first part P1 having a single crystalline structure.

The disclosure is not limited thereto, and various methods for forming an amorphous layer in the second semiconductor substrate 310 may be used to form the third parts P3.

The third parts P3 may be formed vertically spaced apart from each other. Among the third parts P3, a certain third part P3 most adjacent to the top surface of the second semiconductor substrate 310 may be spaced apart at about 100 nanometers to about 500 nanometers from the top surface of the second semiconductor substrate 310. However, the distance between the certain third part P3 and the top surface of the second semiconductor substrate 310 is merely exemplary, the disclosure is not limited thereto, and the third parts P3 may be spaced apart at about at least 500 nanometers from the top surface of the second semiconductor substrate 310. For example, the second semiconductor element 322 may include detailed components such as a device isolation pattern, an n-well layer, a p-well layer, and/or a buried gate electrode formed on an upper portion of the second semiconductor substrate 310. As used herein, a formation depth of the second semiconductor element 322 or a depth of the second semiconductor element 322 may indicate a distance from the top surface of the second semiconductor substrate 310 to a most distant one of the detailed components of the second semiconductor element 322. A distance between the top surface of the second semiconductor substrate 310 and the third part P3 that is most adjacent to the top surface of the second semiconductor substrate 310 may be greater than about 20 times the formation depth of the second semiconductor element 322. When the third parts P3 are formed at positions less than about 20 times the formation depth of the second semiconductor element 322, the second semiconductor element 322 formed on the top surface of the second semiconductor substrate 310 may be damaged in a process for forming the third parts P3. FIG. 14 depicts that the third parts P3 of three layers are formed in the second semiconductor substrate 310, but the disclosure is not limited thereto. In an embodiment, only one or two third parts P3 may be provided; alternatively, four or more third parts P3 may be provided.

In a process for forming the third parts P3, second parts P2 may be formed between the third parts P3 and a first part P1 that is a remaining portion of the second semiconductor substrate 310. The second parts P2 may have more lattice defects than those of the first part P1 and fewer than those of the third part P3. For example, the second part P2 may be an interfacial layer between the first part P1 and the third part P3, or between a single crystalline first part P1 and an amorphous third part P3. Through the processes described above, a second semiconductor chip 300 may be manufactured.

Figure 15:
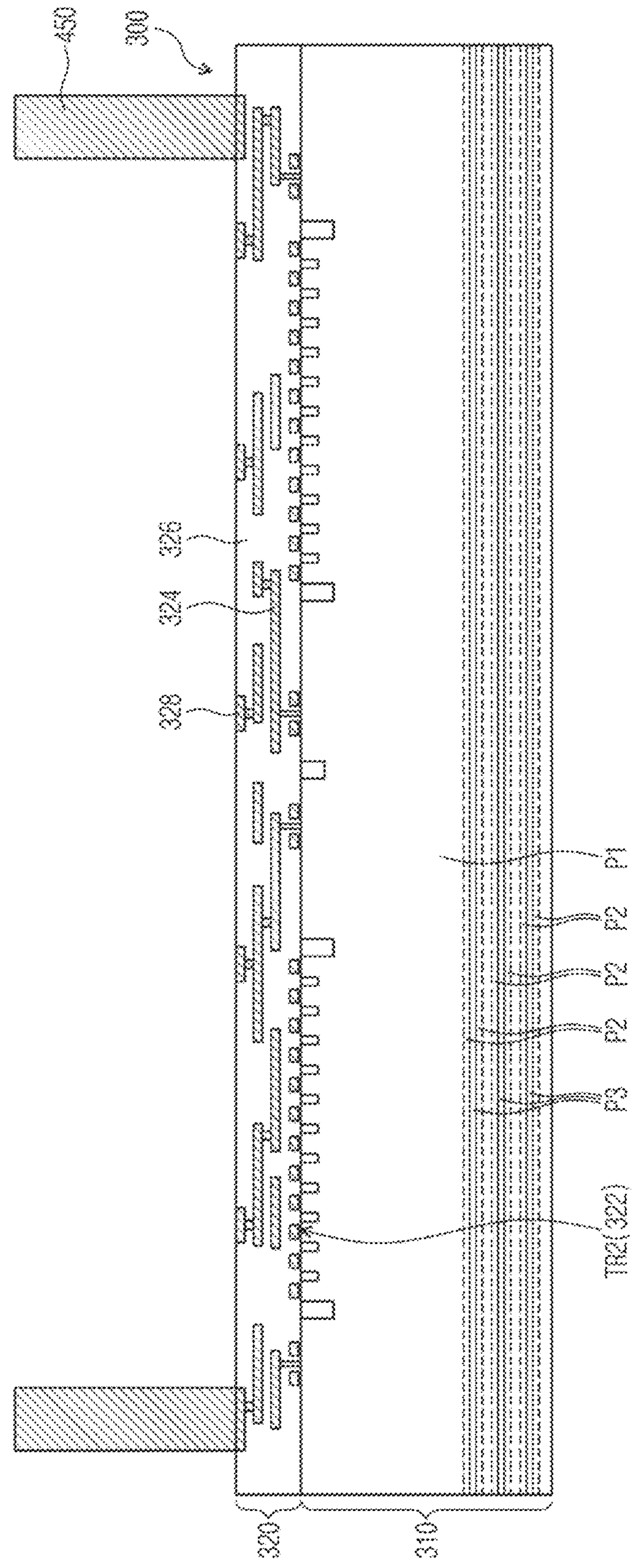

Referring to FIG. 15, conductive posts 450 may be formed on the second semiconductor chip 300. For example, a sacrificial layer may be formed on the second circuit layer 320 of the second semiconductor chip 300, the sacrificial layer may be patterned to form openings that expose the third pads 328, the openings may be filled with a conductive material to form the conductive posts 450, and then the sacrificial layer may be removed.

Figure 16:
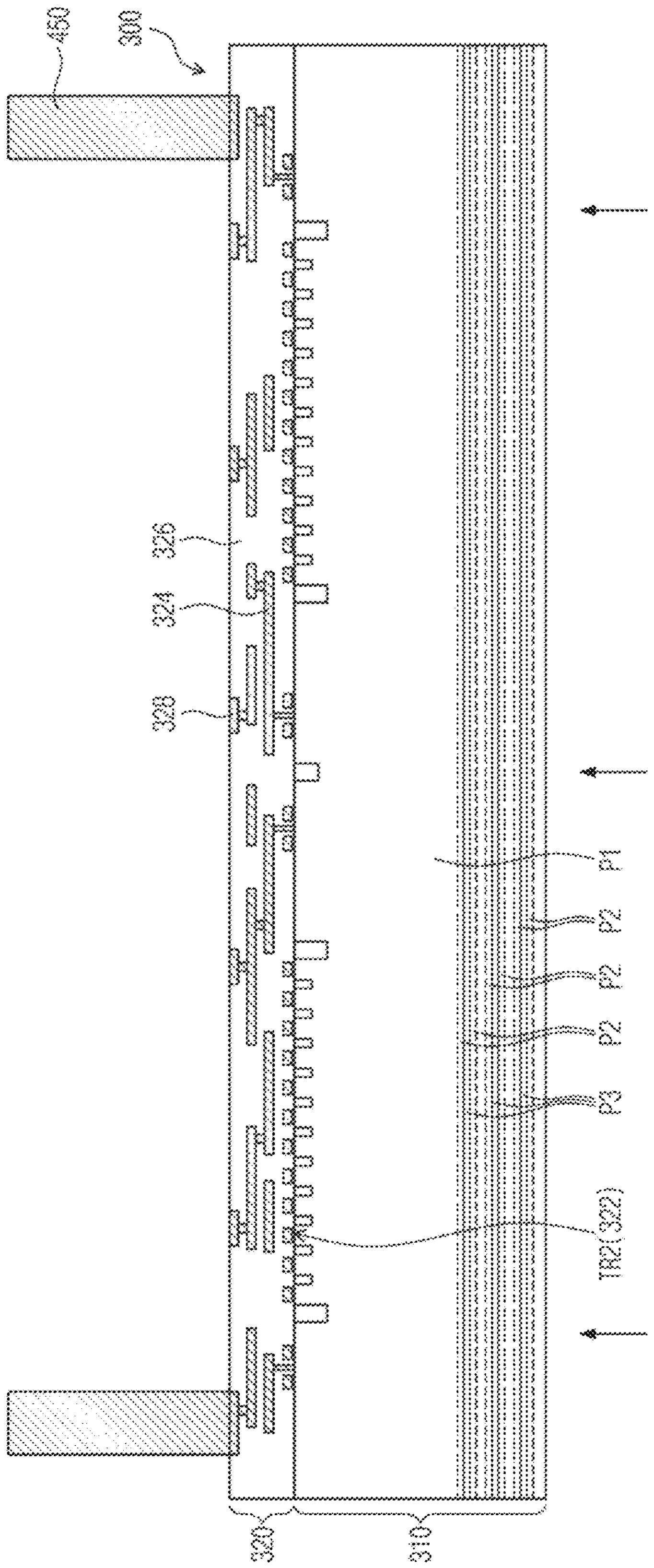

In the embodiment of FIGS. 14 and 15, it is illustrated that the conductive posts 450 are formed after the formation of the second parts P2 and the third parts P3 in the second semiconductor substrate 310, but the disclosure is not limited thereto. As shown in FIG. 16, the conductive posts 450 may be formed on the second semiconductor chip 300, and then the second parts P2 and the third parts P3 may be formed in the second semiconductor substrate 310.

Figure 17:
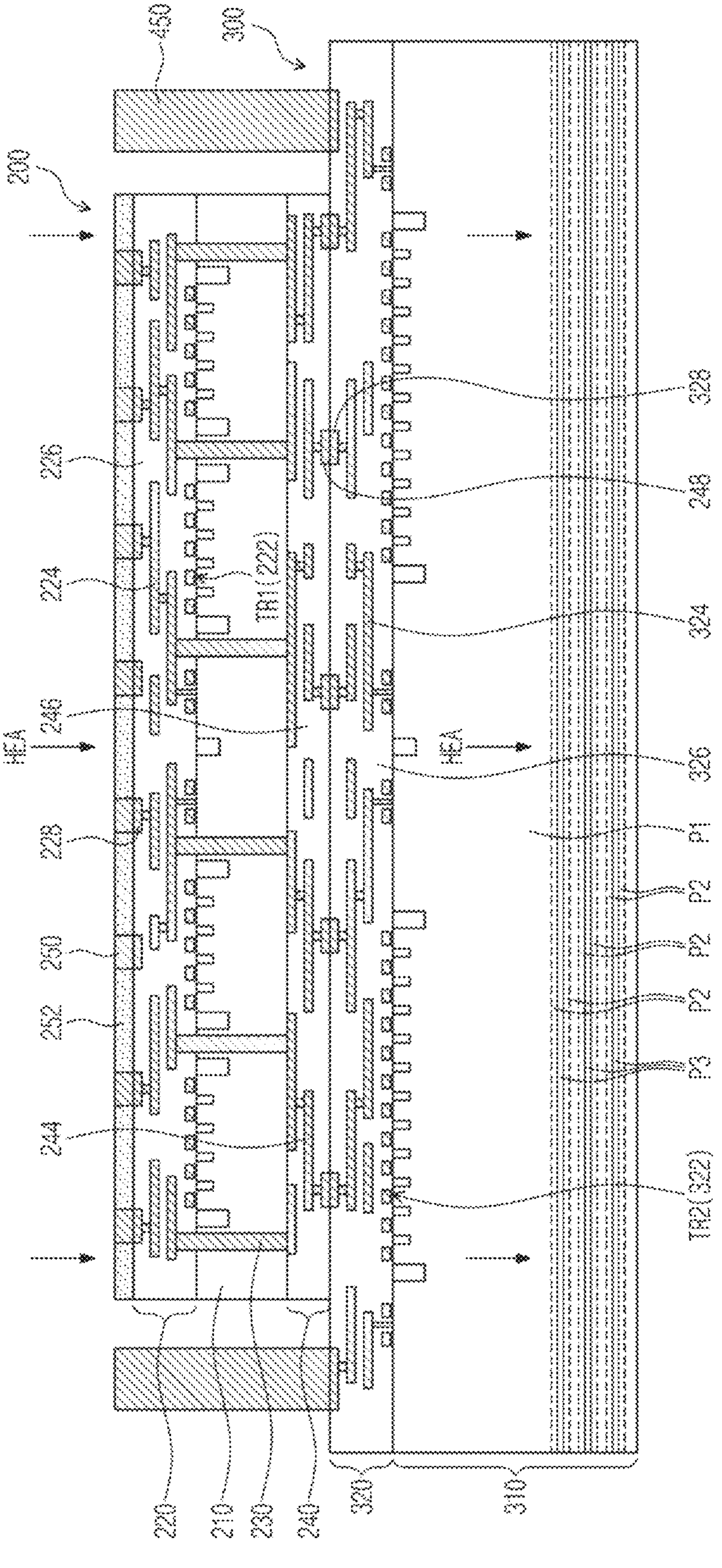

Referring to FIG. 17, the first semiconductor chip 200 may be mounted on the second semiconductor chip 300.

The first semiconductor chip 200 may be aligned on the second semiconductor chip 300 to allow the second pads 248 of the first semiconductor chip 200 to reside on the third pads 328 of the second semiconductor chip 300. The first semiconductor chip 200 may be disposed on the second semiconductor chip 300 to allow the second pads 248 to contact the third pads 328. An annealing process may be performed on the first semiconductor chip 200. The annealing process may bond the second pads 248 to the third pads 328. For example, the second pad 248 and the third pad 328 may be bonded to form a single unitary piece. The bonding between the second pads 248 and the third pads 328 may be performed automatically. For example, the second pad 248 and the third pad 328 may be formed of the same material (e.g., copper (Cu)), and may be bonded to each other by an intermetallic hybrid bonding process resulting from surface activation at an interface between the second pad 248 and the third pad 328 that are in contact with each other.

According to one or more embodiments of the disclosure, the third parts P3, heat shield layers, may be provided in the second semiconductor substrate 310 of the second semiconductor chip 300. Heat HEA provided when the annealing process is performed on the first semiconductor chip 200 may pass through the first semiconductor chip 200 to contribute to the bonding between the second pads 248 and the third pads 328. The third parts P3 may shield the heat HEA in the second semiconductor substrate 310. For example, the heat HEA may be prevented from being downwardly discharged through the second semiconductor chip 300, and most of the heat HEA may be used without loss to bond the second pads 248 to the third pads 328. It may thus be possible to provide a semiconductor package fabrication method whose energy efficiency is increased and whose process temperature is decreased. Furthermore, there may be no requirement of increase in process temperature in consideration of heat loss, and there may be a reduction in the occurrence of high-temperature-induced failure of semiconductor packages.

In FIG. 17, an example is provided in which the first semiconductor chip 200 and the second semiconductor chip 300 are directly bonded to each other, but the disclosure is not limited thereto. According to one or more embodiments, the first semiconductor chip 200 may be mounted on the second semiconductor chip 300 through a connection terminal such as a solder ball. For example, solder balls may be attached to the third pads 328 of the second semiconductor chip 300, the first semiconductor chip 200 may move onto the second semiconductor chip 300 to allow the solder balls to contact the second pads 248 of the first semiconductor chip 200, and a reflow process may be performed to bond the solder balls to the second pads 248 and the third pads 328. An annealing process may be performed in the reflow process, and the third parts P3 may cause that heat of the annealing process to be used without loss for the reflow process of the solder balls. In this case, there may be fabricated a semiconductor package discussed with reference to FIG. 4. The following description will focus on the embodiment of FIG. 17.

Figure 18:
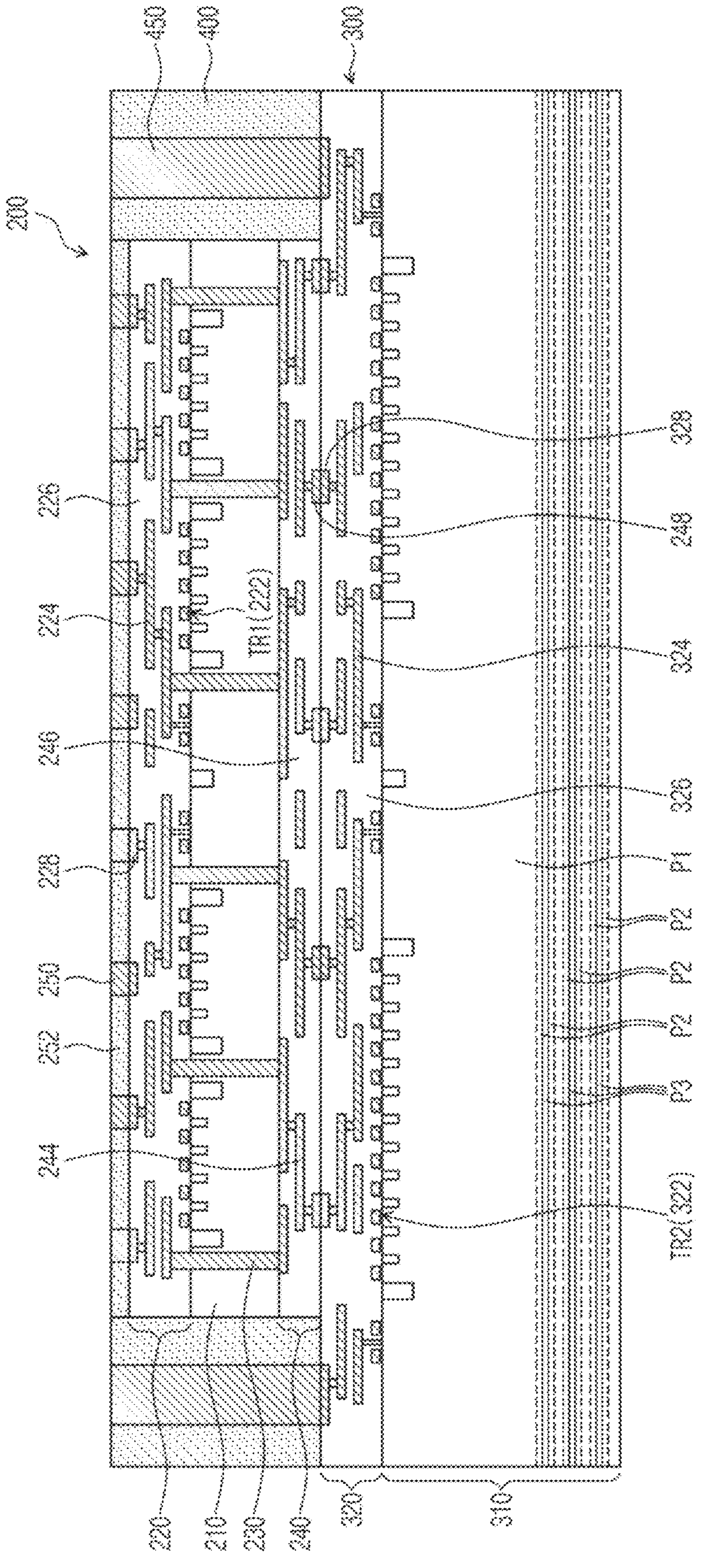

Referring to FIG. 18, a molding layer 400 may be formed on the second semiconductor chip 300. For example, a molding material may be coated or deposited on the second circuit layer 320 of the second semiconductor chip 300, and then the molding material may be cured to form the molding layer 400. On the second semiconductor chip 300, the molding layer 400 may surround the first semiconductor chip 200 and the conductive posts 450. A top surface of the first semiconductor chip 200 and top surfaces of the conductive posts 450 may be exposed on a top surface of the molding layer 400.

Figure 19:
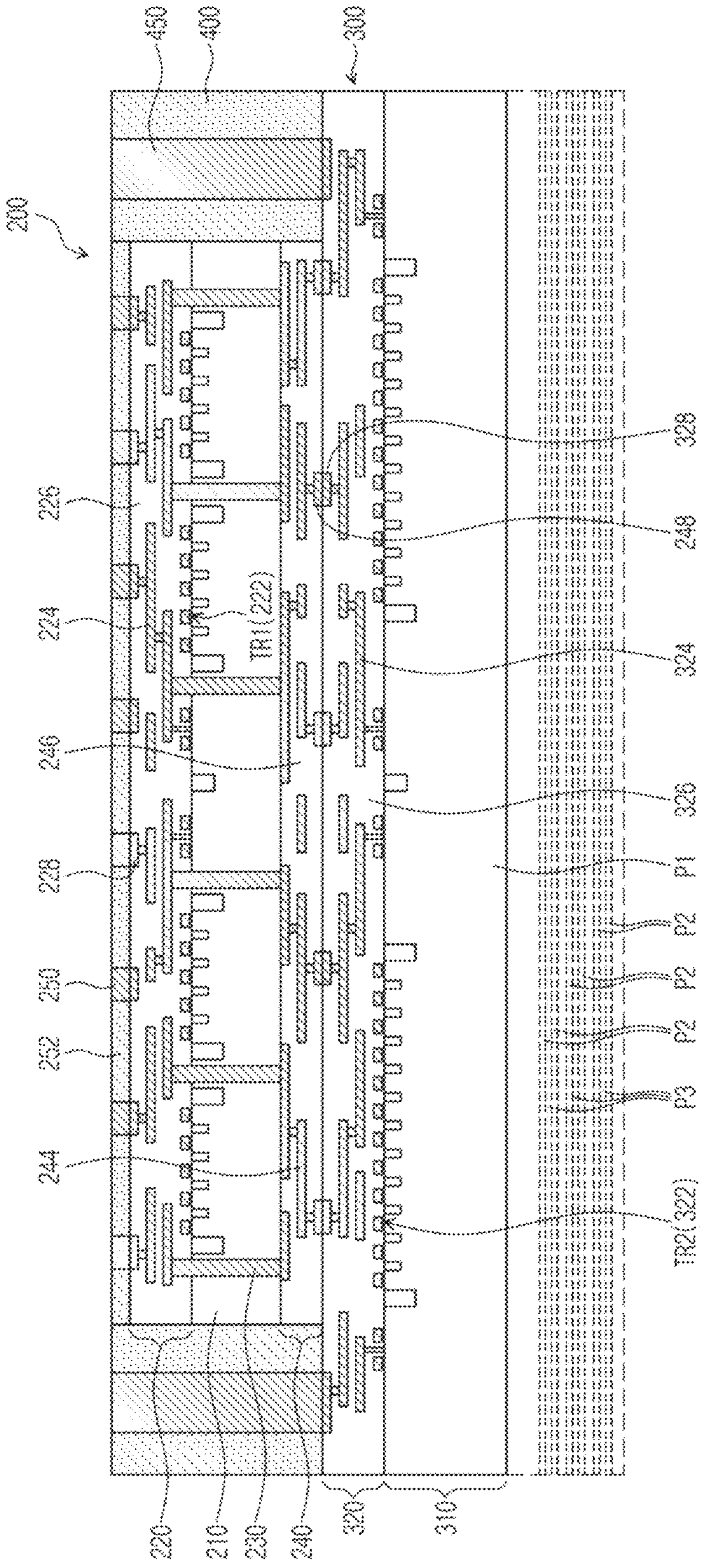

Referring to FIG. 19, a second thinning process may be performed on the bottom surface of the second semiconductor substrate 310. The second thinning process may polish the bottom surface of the second semiconductor substrate 310. For example, the bottom surface of the second semiconductor substrate 310 may undergo a planarization process such as chemical mechanical polishing (CMP). The second thinning process may reduce a thickness of the second semiconductor substrate 310. The second semiconductor substrate 310 may become planarized. The second thinning process may completely remove the third parts P3 and the second parts P2 of the second semiconductor substrate 310.

According to one or more embodiments of the disclosure, the third parts P3 and the second parts P2 used for fabrication process of semiconductor packages may all be removed in a back-end-of-line process. Therefore, heat generated when semiconductor packages are operated may be easily discharged through the second semiconductor substrate 310 of the second semiconductor chip 300. In conclusion, semiconductor packages may be fabricated to have improved thermal radiation properties.

Figure 20:
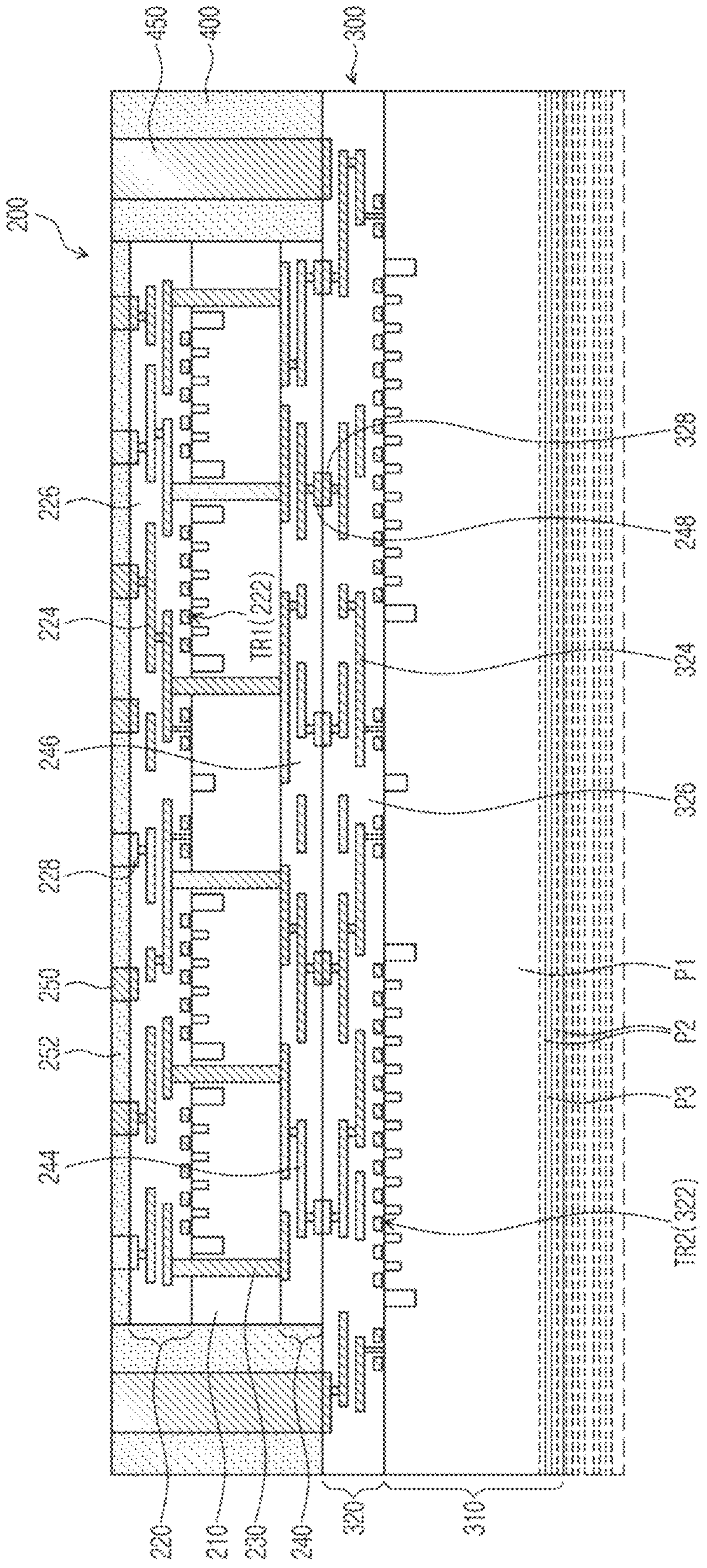

According to one or more embodiments, as shown in FIG. 20, the second thinning process may remove the third parts P3 and the second parts P2 of the second semiconductor substrate 310. In this operation, one of the third parts P3 may not be removed. For example, after the second thinning process, one third part P3 may remain in the second semiconductor substrate 310. After the second thinning process, in accordance with position of the bottom surface of the second semiconductor substrate 310, one of the second parts P2 may be exposed on the bottom surface of the second semiconductor substrate 310 or the third part P3 may be exposed on the bottom surface of the second semiconductor substrate 310. Alternatively, neither the third part P3 nor the second parts P2 may be exposed on the bottom surface of the second semiconductor substrate 310.

According to one or more embodiments of the disclosure, a portion of the third parts P3 may remain without being removed which are used in fabrication process of semiconductor packages. Thus, in accordance with thickness of the third parts P3, the third parts P3 of one or two layers may not excessively inhibit transfer of heat generated when a semiconductor package is operated.

According to one or more embodiments, the second thinning process may remove the third parts P3 and the second parts P2 of the second semiconductor substrate 310. In this operation, all of the third parts P3 may be removed, but one of the second parts P2 may not be removed. In this case, there may be fabricated a semiconductor package discussed with reference to FIG. 1.

Referring back to FIG. 6, a redistribution substrate 100 may be formed on the molding layer 400 and the first semiconductor chip 200. For example, a deposition and patterning of a dielectric layer and a deposition and patterning of a conductive layer may be repeatedly performed on a bottom surface of the molding layer 400 and a bottom surface of the first semiconductor chip 200 to form a redistribution dielectric layer 110 and a redistribution conductive pattern 120. However, in the disclosure, the formation of the redistribution substrate 100 is not limited thereto, and a typical method may be used to form the redistribution substrate 100. Thereafter, external terminals 130 may be provided a pad part of the redistribution substrate 100.

In a semiconductor package and a method of fabricating the same according to one or more embodiments of the disclosure, heat shield layers may be provided in a second semiconductor substrate of a second semiconductor chip having a large width. When an annealing process is performed on a first semiconductor chip, thermal energy may pass through the first semiconductor chip to contribute a bonding between bumps or pads. The heat shield layers may shield the thermal energy in the second semiconductor substrate. For example, the thermal energy may be prevented from being downwardly discharged through the second semiconductor chip, and most of the thermal energy may be used without less to bond the bumps or pads. It may thus be possible to provide a semiconductor package fabrication method whose energy efficiency is increased and whose process temperature is decreased. Furthermore, there may be no requirement of increase in process temperature in consideration of heat loss, and there may be a reduction in the occurrence of high-temperature-induced failure of the semiconductor package.

In addition, the heat shield layers used for fabrication process of the semiconductor package may all or mostly removed in a back-end-of-line process. Therefore, heat generated when the semiconductor package is operated may be easily discharged through the second semiconductor substrate. In conclusion, the semiconductor package may be fabricated to have improved thermal radiation properties.

Although the disclosure has been described in connection with one or more embodiments of the disclosure illustrated in the accompanying drawings, it will be understood by one of ordinary skill in the art that variations in form and detail may be made therein without departing from the spirit and essential feature of the disclosure. The above disclosed embodiments should thus be considered illustrative and not restrictive.

What is claimed is:

1. A semiconductor package comprising:

a first semiconductor chip;

a second semiconductor chip on a top surface of the first semiconductor chip, the second semiconductor chip comprising a width less than a width of the first semiconductor chip; and a molding layer on the first semiconductor chip and surrounding the second semiconductor chip, wherein the first semiconductor chip comprises:

a first semiconductor substrate; and a first circuit layer on a top surface of the first semiconductor substrate, wherein the first semiconductor substrate comprises:

a first part adjacent to the top surface of the first semiconductor substrate; and a second part adjacent to a bottom surface of the first semiconductor substrate, wherein the first part and the second part comprise a semiconductor material, wherein the first part comprises a single crystalline structure, and wherein the second part comprises a polycrystalline structure.

2. The semiconductor package of claim 1, wherein the first part separates the second part from the first circuit layer.

3. The semiconductor package of claim 1, wherein a thickness of the first part is in a range of about 100 nanometers to about 500 nanometers, and wherein a thickness of the second part is in a range of about 1 nanometer to about 50 nanometers.

4. The semiconductor package of claim 1, wherein an average grain size of the second part decreases with increasing distance from the first part.

5. The semiconductor package of claim 1, wherein the second part further comprises an impurity, and wherein the impurity comprises a number of valence electrons that is the same as a number of valence electrons of the semiconductor material.

6. The semiconductor package of claim 1, wherein the semiconductor material comprises silicon (Si).

7. The semiconductor package of claim 1, wherein the second part is exposed on the bottom surface of the first semiconductor substrate.

8. The semiconductor package of claim 1, wherein the second semiconductor chip comprises:

a second semiconductor substrate;

a second circuit layer on a top surface of the second semiconductor substrate;

a first pad on a bottom surface of the second semiconductor substrate; and a via that vertically penetrates the second semiconductor substrate and connects the second circuit layer to the first pad.

9. The semiconductor package of claim 8, wherein the first semiconductor chip further comprises a second pad on a top surface of the first circuit layer, wherein the first semiconductor chip and the second semiconductor chip are in direct contact with each other, and wherein the first pad and the second pad constitute a single unitary piece formed of a material.

10. The semiconductor package of claim 8, wherein the first semiconductor chip further comprises a second pad on a top surface of the first circuit layer, and wherein the second semiconductor chip is mounted on the first semiconductor chip through a connection terminal between the first pad and the second pad.

11. The semiconductor package of claim 1, further comprising:

a redistribution substrate on the molding layer and the second semiconductor chip;

a conductive post that vertically penetrates the molding layer and connects the redistribution substrate to the first semiconductor chip; and an external terminal coupled to the redistribution substrate.

12. A semiconductor package comprising:

a first semiconductor chip;

a second semiconductor chip on a top surface of the first semiconductor chip;

a molding layer on the first semiconductor chip and surrounding the second semiconductor chip;

a redistribution substrate on the molding layer and the second semiconductor chip;

a conductive post that vertically penetrates the molding layer and connects the redistribution substrate to the first semiconductor chip; and an external terminal coupled to the redistribution substrate, wherein the first semiconductor chip comprises:

a first semiconductor substrate;

a first circuit layer on a top surface of the first semiconductor substrate; and a first pad on a top surface of the first circuit layer, wherein the first semiconductor substrate comprises a heat shield layer in the first semiconductor substrate, and wherein the heat shield layer is spaced apart from the top surface of the first semiconductor substrate by a distance of about 100 nanometers to about 500 nanometers.

13. The semiconductor package of claim 12, wherein the heat shield layer and the first semiconductor substrate comprise a semiconductor material, wherein the first semiconductor substrate comprises a single crystalline structure, and wherein the heat shield layer comprises an amorphous structure or a polycrystalline structure.

14. The semiconductor package of claim 13, wherein the semiconductor material comprises silicon (Si).

15. The semiconductor package of claim 13, wherein the heat shield layer further comprises an impurity, and wherein the impurity comprises a number of valence electrons that is the same as a number of valence electrons of the semiconductor material.

16. The semiconductor package of claim 12, wherein a thickness of the heat shield layer is in a range of about 2 nanometers to about 100 nanometers.

17. The semiconductor package of claim 12, wherein the first semiconductor substrate further comprises an interfacial layer between a top surface of the heat shield layer and a bottom surface of the heat shield layer, wherein the interfacial layer and the first semiconductor substrate comprise a semiconductor material, wherein the heat shield layer comprises an amorphous structure, and wherein the interfacial layer comprises a polycrystalline structure.

18. The semiconductor package of claim 17, wherein an average grain size of the interfacial layer decreases with decreasing distance from the heat shield layer.

19. The semiconductor package of claim 17, wherein a thickness of the heat shield layer is in a range of about 40 nanometers to about 50 nanometers.

20. The semiconductor package of claim 12, wherein the second semiconductor chip comprises:

a second semiconductor substrate;

a second circuit layer on a top surface of the second semiconductor substrate;

a second pad on a bottom surface of the second semiconductor substrate; and a chip via that vertically penetrates the second semiconductor substrate and connects the second circuit layer to the second pad.

* * * * *